(12) United States Patent
Wang et al.

(10) Patent No.: US 11,211,910 B1
(45) Date of Patent: Dec. 28, 2021

(54) AUDIO GAIN SELECTION

(71) Applicant: QUALCOMM Incorporated, San Diego, CA (US)

(72) Inventors: Jingbin Wang, Beijing (CN); Xiaoming Bao, Shanghai (CN); Yu Chen, Beijing (CN)

(73) Assignee: Qualcomm Incorproated, San Diego, CA (US)

(*) Notice: Subject to any disclaimer, the term of this patent is extended or adjusted under 35 U.S.C. 154(b) by 0 days.

(21) Appl. No.: 17/062,768

(22) Filed: Oct. 5, 2020

Related U.S. Application Data

(63) Continuation of application No. PCT/CN2020/095309, filed on Jun. 10, 2020.

(51) Int. Cl.
*H04K 1/02* (2006.01)
*H04L 25/03* (2006.01)
*H04L 25/49* (2006.01)
*H03G 3/30* (2006.01)
*H03G 3/32* (2006.01)

(52) U.S. Cl.
CPC .............. *H03G 3/3089* (2013.01); *H03G 3/32* (2013.01)

(58) Field of Classification Search
CPC ........ H03G 3/3089; H03G 3/32; H01Q 1/243; G10L 25/78; H04W 4/029
USPC .................................................. 375/295–297
See application file for complete search history.

(56) References Cited

U.S. PATENT DOCUMENTS

| 5,852,769 A | 12/1998 | Ahmed et al. |
| 6,554,762 B2 | 4/2003 | Leysieffer |
| 6,704,704 B1 | 3/2004 | Newson et al. |
| 7,365,664 B2 | 4/2008 | Caduff et al. |
| 2003/0091180 A1 | 5/2003 | Sorqvist et al. |
| 2011/0250928 A1* | 10/2011 | Schlub .................. H01Q 1/243 455/550.1 |
| 2016/0183046 A1* | 6/2016 | Kwon .................. H04W 4/029 455/456.1 |
| 2019/0385608 A1* | 12/2019 | Lee ......................... G10L 25/78 |

FOREIGN PATENT DOCUMENTS

| CN | 1164171 A | 11/1997 |
| EP | 1703774 A2 | 9/2006 |

OTHER PUBLICATIONS

International Search Report and Written Opinion—PCT/CN2020/095309—ISA/EPO—dated Mar. 15, 2021.

* cited by examiner

*Primary Examiner* — Phuong Phu
(74) *Attorney, Agent, or Firm* — Moore IP

(57) ABSTRACT

A device including one or more processors configured to, based on at least one of an external criterion or a signal-based criterion, output a first gain adjusted signal from a first gain adjuster or a second gain adjusted signal from a second gain adjuster as an input to an audio processing operation. The first gain adjusted signal corresponds to a first gain applied to an audio signal from a microphone and the second gain adjusted signal corresponding to a second gain applied to an audio signal from a microphone. The signal-based criterion is based on whether a first signal metric associated with the first gain adjusted signal or a second signal metric associated with the second gain adjusted signal is closer to a target metric.

30 Claims, 10 Drawing Sheets

AUDIO GAIN SELECTION

I. CROSS REFERENCE TO RELATED APPLICATIONS

The present application claims priority from and is a continuation of pending PCT Patent Application No. PCT/CN2020/095309, filed on Jun. 10, 2020 with the China National Intellectual Property Administration ("CNIPA") as PCT Receiving Office and entitled "AUDIO GAIN SELECTION," which is incorporated herein by reference in its entirety.

II. FIELD

The present disclosure is generally related to audio gain selection.

III. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Such computing devices often incorporate functionality to receive an audio signal from a microphone. For example, the audio signal may represent user speech captured by the microphone. A predetermined gain is applied to the audio signal to amplify the audio signal, such as for voice activation processing. However, the input signal level of the audio signal can vary due to a variety of factors. For example, the signal level can be higher if the user is closer to the microphone or speaking loudly. Alternatively, the signal level can be lower if the user is further away from the microphone or speaking softly. Too high of an applied gain can cause signal saturation when the input signal level is high. Too low of an applied gain can cause difficulty in detecting the user speech when the input signal level is low.

IV. SUMMARY

According to one implementation of the present disclosure, a device includes one or more processors configured to, based on at least one of an external criterion or a signal-based criterion, output a first gain adjusted signal from a first gain adjuster or a second gain adjusted signal from a second gain adjuster as an input to an audio processing operation. The first gain adjusted signal corresponds to a first gain applied to an audio signal from a microphone and the second gain adjusted signal corresponds to a second gain applied to an audio signal from a microphone. The signal-based criterion is based on whether a first signal metric associated with the first gain adjusted signal or a second signal metric associated with the second gain adjusted signal is closer to a target metric.

According to another implementation of the present disclosure, a method includes determining at least one of an external criterion or a signal-based criterion. The signal-based criterion is based on whether a first signal metric associated with a first gain adjusted signal or a second signal metric associated with a second gain adjusted signal is closer to a target metric. The method also includes, based on the at least one determined criterion, outputting the first gain adjusted signal from a first gain adjuster or the second gain adjusted signal from a second gain adjuster as an input to an audio processing operation. The first gain adjusted signal is based on applying a first gain to an audio signal from a microphone. The second gain adjusted signal is based on applying a second gain to the audio signal.

According to another implementation of the present disclosure, a computer-readable storage device stores instructions that, when executed by one or more processors, cause the one or more processors to determine at least one of an external criterion or a signal-based criterion. The signal-based criterion is based on whether a first signal metric associated with a first gain adjusted signal or a second signal metric associated with a second gain adjusted signal is closer to a target metric. The instructions, when executed by the one or more processors, also cause the one or more processors to, based on the at least one determined criterion, output the first gain adjusted signal from a first gain adjuster or the second gain adjusted signal from a second gain adjuster as an input to an audio processing operation. The first gain adjusted signal is based on applying a first gain to an audio signal from a microphone. The second gain adjusted signal is based on applying a second gain to the audio signal.

According to another implementation of the present disclosure, an apparatus includes means for determining at least one of an external criterion or a signal-based criterion. The signal-based criterion is based on whether a first signal metric associated with a first gain adjusted signal or a second signal metric associated with a second gain adjusted signal is closer to a target metric. The apparatus also includes means for outputting one of the first gain adjusted signal from a first gain adjuster or the second gain adjusted signal from a second gain adjuster as an input to an audio processing operation. The one of the first gain adjusted signal or the second gain adjusted signal output is based on the at least determined criterion. The first gain adjusted signal is based on applying a first gain to an audio signal from a microphone. The second gain adjusted signal is based on applying a second gain to the audio signal.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

An audio signal received from a microphone is usually amplified by applying a gain to the audio signal prior to performing other audio processing operations. Too high of an applied gain can cause signal saturation when an input signal level of the audio signal is high. Too low of an applied gain can cause difficulty in detecting any user speech when the input signal level is low.

Systems and methods of audio gain selection for a received audio signal from a microphone are disclosed. For example, a device includes multiple gain adjusters with a first gain adjuster configured to apply a lower gain to the audio signal and a second gain adjuster configured to apply a higher gain to the audio signal. A gain controller outputs one of a first gain adjusted signal from the first gain adjuster or a second gain adjusted signal from the second gain adjuster as input to an audio processing operation. For example, the gain controller outputs the first gain adjusted signal (e.g., corresponding to the lower gain) in response to determining that the audio signal is likely to have a higher input level (e.g., during the day-time when a user is closer to the device). In a particular example, the gain controller outputs the first gain adjusted signal (e.g., corresponding to the lower gain) in response to determining that clipping is detected in the second gain adjusted signal indicating that the second gain adjusted signal is saturated. Alternatively, the gain controller outputs the second gain adjusted signal in response to determining that the audio signal is likely to have a lower input level (e.g., during the night-time or when the user is further away from the device) and clipping is not detected in the second gain adjusted signal.

Figure 1:
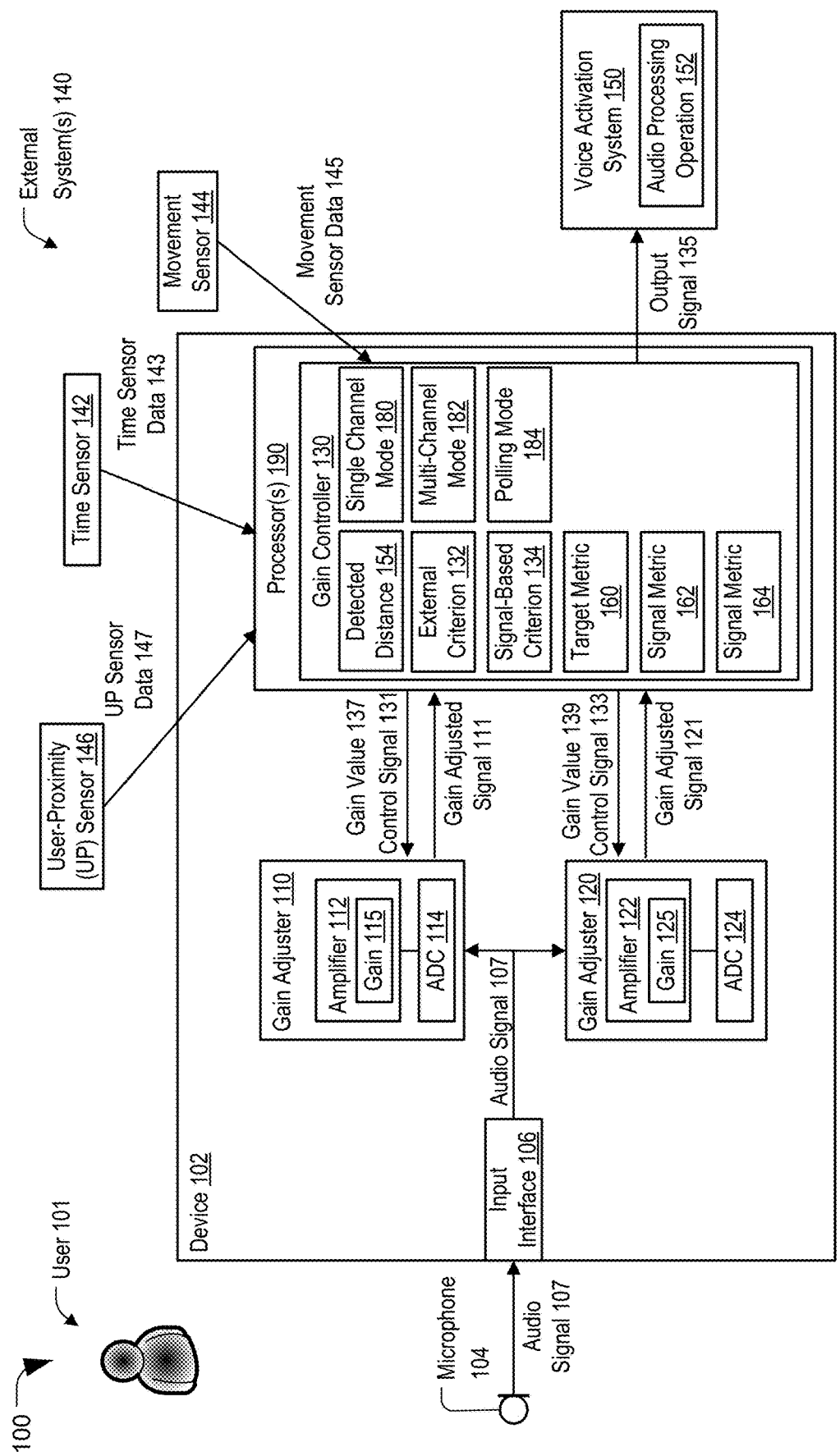
FIG. 1 is a block diagram of a particular illustrative aspect of a system operable to perform audio gain selection, in accordance with some examples of the present disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. To illustrate, FIG. 1 depicts a device 102 including one or more processors ("processor(s)" 190 of FIG. 1), which indicates that in some implementations the device 102 includes a single processor 190 and in other implementations the device 102 includes multiple processors 190. For ease of reference herein, such features are generally introduced as "one or more" features and are subsequently referred to in the singular unless aspects related to multiple of the features are being described.

It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

As used herein, "coupled" may include "communicatively coupled," "electrically coupled," or "physically coupled," and may also (or alternatively) include any combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive signals (e.g., digital signals or analog signals) directly or indirectly, via one or more wires, buses, networks, etc. As used herein, "directly coupled" may include two devices that are coupled (e.g., communicatively coupled, electrically coupled, or physically coupled) without intervening components.

In the present disclosure, terms such as "determining," "calculating," "estimating," "shifting," "adjusting," etc. may be used to describe how one or more operations are performed. It should be noted that such terms are not to be construed as limiting and other techniques may be utilized to perform similar operations. Additionally, as referred to herein, "generating," "calculating," "estimating," "using," "selecting," "accessing," and "determining" may be used interchangeably. For example, "generating," "calculating," "estimating," or "determining" a parameter (or a signal) may refer to actively generating, estimating, calculating, or determining the parameter (or the signal) or may refer to using, selecting, or accessing the parameter (or signal) that is already generated, such as by another component or device.

Referring to FIG. 1, a particular illustrative aspect of a system configured to select a gain for a received microphone signal is disclosed and generally designated 100. The system 100 includes a device 102 coupled to a microphone 104, one or more external systems 140, a voice activation system 150, or a combination thereof.

The device 102 includes an input interface 106 configured to be coupled to the microphone 104. The input interface 106 is coupled to a gain adjuster 110 and a gain adjuster 120. The input interface 106 is configured to receive an audio signal 107 from the microphone 104 and to provide the audio signal 107 to the gain adjuster 110 and the gain adjuster 120. The device 102 also includes one or more processors 190. The processor 190 includes a gain controller 130 coupled to the gain adjuster 110 and the gain adjuster 120. The particular configuration in which the input interface 106 and the gain controller 130 are coupled to two gain adjusters is provided as an illustrative example. In other implementations, the input interface 106 and the gain controller 130 are coupled to more than two gain adjusters.

A gain adjuster is a device, component, or circuit that is configured to apply a gain to an audio signal, convert an analog signal to a digital signal, or both. For example, the gain adjuster 110 includes an amplifier 112 configured to generate a gain adjusted signal by applying a gain 115 (e.g., 7.5 decibels (dB)) to an audio signal and an ADC 114 configured to generate a digital signal by performing an analog-to-digital conversion on an analog signal. To illustrate, the gain adjuster 110 is configured to generate a gain adjusted signal 111 by applying the gain 115, performing an analog-to-digital conversion, or both, to the audio signal 107. The gain adjuster 120 includes an amplifier 122 configured to generate a gain adjusted signal by applying a gain 125 (e.g., 27.0 dB) to an audio signal and an ADC 124 configured to generate a digital signal by performing an analog-to-digital conversion on an analog signal. To illustrate, the gain adjuster 120 is configured to generate a gain adjusted signal 121 by applying the gain 125, performing an analog-to-digital conversion, or both, to the audio signal 107.

In a particular aspect, the gain 115 is less than the gain 125. For example, the gain adjusted signal 111 corresponds to a lower gain applied to the audio signal 107, and the gain adjusted signal 121 corresponds to a higher gain applied to the audio signal 107. When the audio signal 107 has higher power (e.g., higher volume of user speech), the higher gain 125 could cause signal saturation. In these cases, providing the gain adjusted signal 111 corresponding to the lower gain 115 to an audio processing operation 152 could lead to improved performance of the audio processing operation 152. In a particular example, the audio processing operation 152 includes a speech recognition operation (e.g., a keyword detection operation). When the audio signal 107 has lower power (e.g., lower volume of user speech), the lower gain 115 could reduce detectability of the user speech. In these cases, providing the gain adjusted signal 121 corresponding to the higher gain 125 to the audio processing operation 152 could lead to improved performance of the audio processing operation 152.

The gain controller 130 is coupled to one or more external systems 140. For example, the external system 140 includes a time sensor 142, a movement sensor 144, a user-proximity (UP) sensor 146, or a combination thereof. The time sensor 142 is configured to generate time sensor data 143 that indicates a detected time of the day (e.g., night-time, day-time, system clock time, or a combination thereof). In some examples, the time sensor 142 includes one or more of a clock, wireless signal indicating time (e.g., a global positioning system (GPS) signal), or a camera, as further described with reference to FIG. 2. The movement sensor 144 is configured to generate movement sensor data 145 that indicates an amount of detected movement. In some examples, the movement sensor 144 includes one or more of a GPS receiver, a camera, or an accelerometer, as further described with reference to FIG. 2. The UP sensor 146 is configured to generate UP sensor data 147 that indicates a detected distance 154 of a user. In some examples, the UP sensor 146 includes one or more of a camera or the microphone 104, as further described with reference to FIG. 2.

Although the time sensor 142, the movement sensor 144, and the UP sensor 146 are illustrated as separate components, in other implementations, one or more of the time sensor 142, the movement sensor 144, or the user-proximity UP sensor 146 can be combined in a single component. In a particular example, a camera can operate as one or more of the time sensor 142, the movement sensor 144, or the user-proximity UP sensor 146. To illustrate, the gain controller 130 can process image data from the camera as the time sensor data 143 by detecting night-time or day-time based on an amount of light indicated by the image data. The gain controller 130 can process the image data from the camera as the movement sensor data 145 by detecting an amount of movement indicated by the image data. For example, the image data includes time-sequenced image frames that can be analyzed to detect the amount of movement. The gain controller 130 can process the image data from the camera as the UP sensor data 147 by determining the detected distance 154 of a user based on an image of the user indicated by the image data. In a particular aspect, the gain controller 130 is configured to update the gain 115, the gain 125, or both, based on the detected distance 154.

The gain controller 130 is configured to determine at least one of an external criterion 132 or a signal-based criterion 134. The external criterion 132 is based on external data from the external system 140. In a particular aspect, the gain controller 130 is configured to determine the external criterion 132 based on the time sensor data 143, the movement sensor data 145, the UP sensor data 147, one or more other types of external data, or a combination thereof. The signal-based criterion 134 is based on the gain adjusted signal 111, the gain adjusted signal 121, or both. For example, the gain controller 130 is configured to determine a signal metric 162 based on the gain adjusted signal 111, a signal metric 164 based on the gain adjusted signal 121, or both. In a particular aspect, the gain controller 130 is configured to determine the signal-based criterion 134 based on at least one of the signal metric 162, the signal metric 164, or a target metric 160. For example, the signal-based criterion 134 is based on whether the signal metric 162 or the signal metric 164 is closer to the target metric 160. The target metric 160 is based on default data, a configuration setting, user input, or a combination thereof. In a particular aspect, the target metric 160 represents an audio signal with an audio level that is large enough to improve (e.g., to maximize) detection of features in the signal without saturating (which causes loss of feature information in the signal).

The gain controller 130 is configured to output, based on at least one of the external criterion 132 or the signal-based criterion 134, one of the gain adjusted signal 111 or the gain adjusted signal 121 as an input to the voice activation system 150. For example, the gain controller 130 provides an output signal 135 to the voice activation system 150, and the output signal 135 includes the gain adjusted signal 111 or the gain adjusted signal 121. The voice activation system 150 is configured to perform the audio processing operation 152 based on the output signal 135.

During operation, the input interface 106 receives an audio signal 107 from the microphone 104. For example, the audio signal 107 corresponds to speech, e.g., from a user 101, that is captured by the microphone 104. In a particular example, the audio signal 107 indicates one or more keywords (e.g., "hey assistant") spoken by the user 101 to initiate operations of the voice activation system 150 (e.g., wake up a virtual assistant, transition the device 102 to an active mode, or both). The input interface 106 provides the audio signal 107 to the gain adjuster 110, the gain adjuster 120, one or more additional gain adjusters, or a combination thereof.

The gain controller 130 receives external data from the external system 140, e.g., concurrently with the input interface 106 receiving the audio signal 107 from the microphone 104. For example, the gain controller 130 receives the time sensor data 143, the movement sensor data 145, the UP sensor data 147, or a combination thereof, concurrently with receipt of the audio signal 107 by the input interface 106. In a particular aspect, the gain controller 130 determines a detected distance 154 between the device 102 and the user 101 based on the UP sensor data 147. In a particular example, the UP sensor 146 includes an image sensor (e.g., a camera), the UP sensor data 147 includes image data representing an image of the user 101 captured by the image sensor, and the gain controller 130 determines the detected distance 154 by performing image analysis of the image. In another example, the UP sensor 146 includes the microphone 104, the UP sensor data 147 includes the audio signal 107, and the gain controller 130 determines the detected distance 154 by performing audio analysis of the audio signal 107.

In a particular implementation, the gain 115 (e.g., 7.5 dB), the gain 125 (e.g., 27.0 dB), or both, are based on one or more configuration settings, default values, user inputs, hardware configurations, or a combination thereof. In a particular implementation, the gain controller 130 is configured to update the gain 115, the gain 125, or both, based on external data from the external system 140. In a particular example, the gain controller 130 sets the gain 115 to a first value (e.g., 7.5 dB) in response to determining that the detected distance 154 is less than or equal to a threshold distance (e.g., 0.3 meters). Alternatively, the gain controller 130 sets the gain 115 to a second value (e.g., 13.5 dB) in response to determining that the detected distance 154 (e.g., 0.6 meters) is greater than the threshold distance (e.g., 0.3 meters). To illustrate, the gain 115 is lower if the detected distance 154 indicates that the user 101 is closer to the device 102.

In a particular implementation, the gain controller 130 is configured to update the gain 115, the gain 125, or both, based on historical data from the voice activation system 150. For example, the gain controller 130 determines that the historical data indicates greater than threshold errors in speech detection under particular conditions (e.g., a particular user, a particular day period, a particular time range, a detected distance, or a combination thereof) with a particular value (e.g., 7.5 dB) of the gain 115. The gain controller 130, in response to detecting the particular conditions (e.g., the particular user, the particular day period, a time in the particular time range, the detected distance, or a combination thereof), sets the gain 115 to a second value (e.g., 13.5 dB) that is higher than the particular value (e.g., 7.5). As another example, the gain controller 130 determines that the historical data indicates greater than threshold occurrences of saturation under particular conditions (e.g., a particular user, a particular day period, a particular time range, a detected distance, or a combination thereof) with a particular value (e.g., 27.0 dB) of the gain 125. The gain controller 130, in response to detecting the particular conditions (e.g., the particular user, the particular day period, a time in the particular time range, the detected distance, or a combination thereof), sets the gain 125 to a second value (e.g., 24.0 dB) that is lower than the particular value (e.g., 27.0 dB).

In a particular implementation, the gain controller 130 determines an external criterion 132 based on the external data and activates the gain adjuster 110, the gain adjuster 120, or both, based on the external criterion 132, as further described with reference to FIG. 2. In one example, the gain controller 130 activates the gain adjuster 110 and deactivates the gain adjuster 120 in response to determining that the external criterion 132 indicates that the audio signal 107 likely corresponds to a higher power (e.g., a louder volume) audio signal and a lower gain would be more suitable, such as when the user 101 is relatively near the device 102 during the day-time. Alternatively, the gain controller 130 activates the gain adjuster 120 and deactivates the gain adjuster 110 in response to determining that the external criterion 132 indicates that the audio signal 107 likely corresponds to a lower power (e.g., lower volume) audio signal and a higher gain would be more suitable, such as when the user 101 is relatively far from the device 102 or when the audio signal 107 is received in the middle of the night.

In a particular example, the gain controller 130 activates both the gain adjuster 110 and the gain adjuster 120 in response to determining that the external criterion 132 indicates that either the lower gain 115 or the higher gain 125 could be suitable. In a particular implementation, the gain adjuster 110 and the gain adjuster 120 are activated independently of the external criterion 132 (e.g., always activated when the device 102 is activated).

The gain controller 130 supports multiple operating modes, including a single channel mode 180, a multi-channel mode 182, and a polling mode 184. The single channel mode 180 corresponds to a single one of the gain adjuster 110 or the gain adjuster 120 being activated. The multi-channel mode 182 corresponds to multiple gain adjusters (e.g., the gain adjuster 110 and the gain adjuster 120) being activated.

The polling mode 184 corresponds to the gain controller 130 activating multiple gain adjusters (e.g., the gain adjuster 110 and the gain adjuster 120) during a polling stage of the polling mode 184 and activating a single one of the gain adjuster 110 or the gain adjuster 120 during an inter-polling stage of the polling mode 184, as further described with reference to FIG. 2. For example, during the polling stage, the gain controller 130 determines whether the lower gain or the higher gain would be more suitable, and uses the gain adjusted audio signal corresponding to the suitable gain during the inter-polling stage. Polling intermittently enables the gain controller 130 to dynamically adjust to changing conditions, while conserving power during the inter-polling stage by activating a single gain adjuster.

In a particular implementation, the gain controller 130 is configured to transition between the single channel mode 180, the multi-channel mode 182, the polling mode 184, or a combination thereof, as further described with reference to FIG. 2. For example, the gain controller 130 could transition to the multi-channel mode 182 in response to determining that a power mode (e.g., a charging mode or a battery life) of the device 102 indicates that power conservation is not a high priority.

In a particular implementation, the gain controller 130 sends a control signal 131 to the gain adjuster 110 to activate or deactivate the gain adjuster 110. For example, a first logical value (e.g., 1) of the control signal 131 activates the gain adjuster 110 and a second logical value (e.g., 0) of the control signal 131 deactivates the gain adjuster 110. Similarly, the gain controller 130 sends a control signal 133 to the gain adjuster 120 to activate or deactivate the gain adjuster 120. For example, a first logical value (e.g., 1) of the control signal 133 activates the gain adjuster 120 and a second logical value (e.g., 0) of the control signal 133 deactivates the gain adjuster 120.

The gain adjuster 110, while activated, generates a gain adjusted signal 111 by applying the gain 115 to the audio signal 107. In a particular aspect, the audio signal 107 includes an analog signal, the ADC 114 generates a digital signal by performing an analog-to-digital conversion of the audio signal 107, and the amplifier 112 generates the gain adjusted signal 111 by applying the gain 115 to the digital signal. In an alternative implementation, the amplifier 112 generates a gain adjusted analog signal by applying the gain 115 to the audio signal 107 (e.g., an analog signal) and the ADC 114 generates the gain adjusted signal 111 by performing an analog-to-digital conversion of the gain adjusted analog signal. In a particular implementation, the gain adjuster 110 includes the amplifier 112 and does not include an ADC to perform the analog-to-digital conversion. For example, the amplifier 112 generates the gain adjusted signal 111 by applying the gain 115 to the audio signal 107. The gain adjuster 110, while activated, provides the gain adjusted signal 111 to the gain controller 130.

Similarly, the gain adjuster 120, while activated, generates a gain adjusted signal 121 by applying the gain 125 to the audio signal 107. In a particular implementation, the ADC 124 generates a digital signal by performing an analog-to-digital conversion of the audio signal 107, and the amplifier 122 generates the gain adjusted signal 121 by applying the gain 125 to the digital signal. In an alternative implementation, the amplifier 122 generates a gain adjusted analog signal by applying the gain 125 to the audio signal 107 (e.g., an analog signal) and the ADC 124 generates the gain adjusted signal 121 by performing an analog-to-digital conversion of the gain adjusted analog signal. In a particular implementation, the gain adjuster 120 includes the amplifier 122 and does not include an ADC to perform the analog-to-digital conversion. For example, the amplifier 122 generates the gain adjusted signal 121 by applying the gain 125 to the audio signal 107. The gain adjuster 120, while activated, provides the gain adjusted signal 121 to the gain controller 130.

During the single channel mode 180 or the inter-polling stage of the polling mode 184, the gain controller 130 receives a gain adjusted signal (e.g., the gain adjusted signal 111 or the gain adjusted signal 121) from a single one of the gain adjuster 110 or the gain adjuster 120 and provides the received gain adjusted signal as an output signal 135 to the voice activation system 150, as further described with reference to FIGS. 3 and 5.

During the multi-channel mode 182 or the polling stage of the polling mode 184, the gain controller 130 receives multiple gain adjusted signals from multiple gain adjusters. For example, the gain controller 130 receives the gain adjusted signal 111 from the gain adjuster 110 and the gain adjusted signal 121 from the gain adjuster 120. The gain controller 130 generates a signal metric 162 based on the gain adjusted signal 111, a signal metric 164 based on the gain adjusted signal 121, or both, as further described with reference to FIG. 4. The gain controller 130 determines the signal-based criterion 134 based on the signal metric 162, the signal metric 164, the target metric 160, or a combination thereof, as further described with reference to FIG. 4. For example, the signal-based criterion 134 is based on whether the signal metric 162 or the signal metric 164 is closer to the target metric 160. To illustrate, the target metric 160 is based on an audio model, and a gain adjusted signal that is closer to the target metric 160 results in improved performance of the audio processing operation 152. The gain controller 130 provides one of the gain adjusted signal 111 or the gain adjusted signal 121 corresponding to a metric (e.g., the signal metric 162 or the signal metric 164) that is closer to the target metric 160 as an input to the audio processing operation 152. For example, the gain controller 130 provides an output signal 135 to the voice activation system 150 and the output signal 135 includes the one of the gain adjusted signal 111 or the gain adjusted signal 121.

The voice activation system 150 performs the audio processing operation 152 based on the output signal 135. For example, the audio processing operation 152 includes keyword detection of the voice activation system 150, and the voice activation system 150 initiates particular operations based on one or more keywords (e.g., "hey virtual assistant, how's the weather tomorrow?") detected in the output signal 135. The output signal 135 (e.g., the gain adjusted signal 111) corresponds to a lower gain applied to the audio signal 107 when the audio signal 107 is likely to correspond to a higher power audio signal. Alternatively, when the audio signal 107 is likely to correspond to a lower power audio signal, the output signal 135 (e.g., gain adjusted signal 121) corresponds to a higher gain applied to the audio signal 107.

The system 100 thus improves performance of the audio processing operation 152 by dynamically applying a suitable gain regardless of whether the audio signal 107 corresponds to a lower power audio signal or a higher power audio signal. The higher gain improves a detectability of user speech in the output signal 135 when the audio signal 107 corresponds to a lower power audio signal. Alternatively, when the audio signal 107 corresponds to a higher power audio signal, the lower gain reduces a likelihood that the output signal 135 provided to the audio processing operation 152 is saturated.

Figure 2:
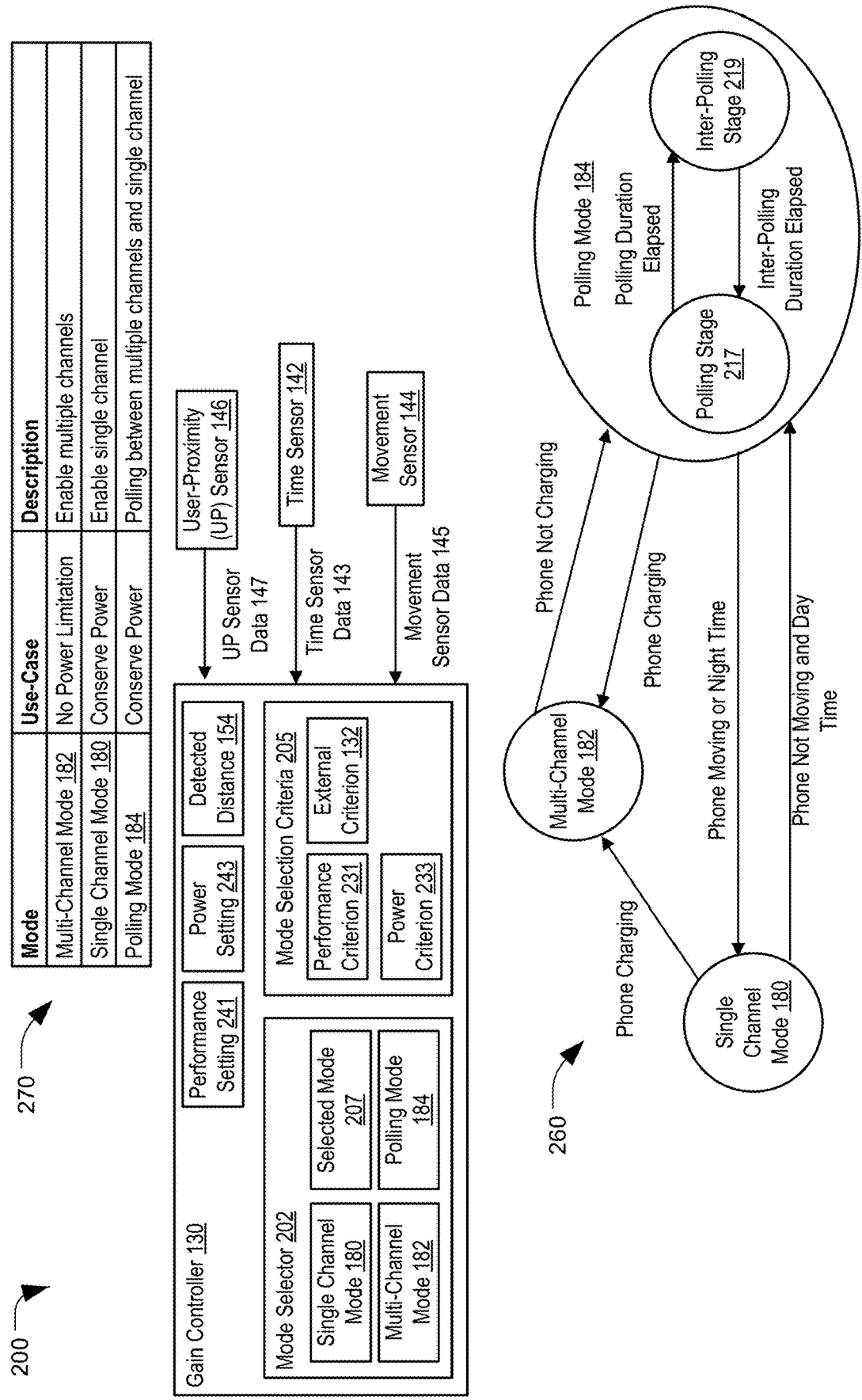
FIG. 2 is a diagram of an illustrative aspect of a gain controller of the system of FIG. 1, in accordance with some examples of the present disclosure.

Referring to FIG. 2, a diagram 200 includes an example of the gain controller 130 that includes a mode selector 202 that is configured to select one of the single channel mode 180, the multi-channel mode 182, or the polling mode 184 as a selected mode 207.

The gain controller 130 is configured to perform operations corresponding to the selected mode 207. The diagram 200 includes a table 270 that indicates examples of use-cases for the various modes. For example, the multi-channel mode 182 corresponds to a use-case without a power limitation (e.g., improving performance is a high priority). Each of the single channel mode 180 and the polling mode 184 corresponds to a use-case with power conservation (e.g., reducing power consumption is a high priority).

In a particular aspect, the mode selector 202 is configured to determine the selected mode 207 based on one or more mode selection criteria 205. The mode selection criteria 205 include a performance criterion 231, a power criterion 233, the external criterion 132, one or more additional criteria, or a combination thereof. The performance criterion 231 and the power criterion 233 are shown as distinct from the external criterion 132 as an illustrative example. In some implementations, the external criterion 132 includes the performance criterion 231, the power criterion 233, or both.

In a particular example, the power criterion 233 can be based on a power setting 243 of the gain controller 130, the device 102 of FIG. 1, or both. To illustrate, the power criterion 233 can indicate that the multi-channel mode 182 is to be selected when the power setting 243 indicates that the device 102 is charging (e.g., connected to an external power source). In a particular implementation, the power criterion 233 can indicate that the polling mode 184 is to be selected when the power setting 243 indicates that the device 102 not charging and a remaining battery life is greater than or equal to a threshold, that the single channel mode 180 is to be selected when the power setting 243 indicates that the device 102 is not charging and the remaining battery life is less than the threshold, or both.

In a particular implementation, the power criterion 233 can indicate that the mode selector 202 is to select between two of the three modes. For example, the power criterion 233 can indicate that the multi-channel mode 182 is to be selected when the power setting 243 indicates that the device 102 is charging and that the single channel mode 180 is to be selected when the power setting 243 indicates that the device 102 is not charging. In this example, the polling mode 184 is not to be selected. In another particular example, the power criterion 233 can indicate that the multi-channel mode 182 is to be selected when the power setting 243 indicates that the device 102 is charging and that the polling mode 184 is to be selected when the power setting 243 indicates that the device 102 is not charging. In this example, the single channel mode 180 is not to be selected. In a particular example, the power criterion 233 can indicate that the polling mode 184 is to be selected when the power setting 243 indicates that the device 102 is charging and that the single channel mode 180 is to be selected when the power setting 243 indicates that the device 102 is not charging. In this example, the multi-channel mode 182 is not to be selected.

In a particular example, the performance criterion 231 can be based on a performance setting 241 of the gain controller 130, the device 102 of FIG. 1, or both. To illustrate, the performance criterion 231 can indicate that the multi-channel mode 182 is to be selected when the performance setting 241 performance is a high priority (e.g., improving performance is a higher priority than reducing power consumption). In a particular implementation, the performance criterion 231 can indicate that the polling mode 184 is to be selected when the performance setting 241 indicates that performance is a medium priority (e.g., improving performance is the same priority as reducing power consumption), that the single channel mode 180 is to be selected when the performance setting 241 indicates that performance is a low priority (e.g., improving performance is a lower priority than reducing power consumption), or both.

In a particular implementation, the performance criterion 231 can indicate that the mode selector 202 is to select between two of the three modes. For example, the performance criterion 231 can indicate that the multi-channel mode 182 is to be selected when the performance setting 241 indicates that performance is a high priority and that the single channel mode 180 is to be selected when the performance setting 241 indicates that power consumption is a high priority. In this example, the polling mode 184 is not to be selected. In another particular example, the performance criterion 231 can indicate that the multi-channel mode 182 is to be selected when the performance setting 241 indicates that performance is a high priority and that the polling mode 184 is to be selected when the performance setting 241 indicates that power consumption is a high priority. In this example, the single channel mode 180 is not to be selected. In a particular example, the performance criterion 231 can indicate that the polling mode 184 is to be selected when the performance setting 241 performance is a high priority and that the single channel mode 180 is to be selected when the performance setting 241 indicates that power consumption is a high priority. In this example, the multi-channel mode 182 is not to be selected. In a particular aspect, the performance setting 241, the power setting 243, or both, are based on a default value, user input, a configuration setting, an input from an external system 140, a hardware configuration, or a combination thereof.

In a particular example, the external criterion 132 can be based on the time sensor data 143, the movement sensor data 145, the UP sensor data 147, or a combination thereof. The time sensor data 143 indicates a day period (e.g., night-time or day-time), a time of day (e.g., a clock time), or both. In a particular implementation, the time sensor 142 includes a clock (e.g., system clock of the device 102 of FIG. 1 or an external clock) and the time sensor data 143 is based on a time indicated by the clock. In a particular implementation, the time sensor 142 includes an image sensor and the time sensor data 143 includes an image frame captured by the image sensor. In a particular example, the mode selector 202 determines a time based on a timestamp of the image frame. In another example, the mode selector 202 determines a day period based on an amount of light detected in the image frame. In a particular implementation, the time sensor 142 includes a wireless signal (e.g., a GPS signal) that indicates time and the mode selector 202 determines a time based on data (e.g., the time sensor data 143) indicated by the wireless signal.

In a particular aspect, the external criterion 132 includes a time-based criterion and is based on the day period, the time of day, or both, indicated by the time sensor data 143. For example, a first day period (e.g., night-time), a first time of day (e.g., late night hours between 8 pm and 6 am), or both, correspond to a higher likelihood that an input audio level (e.g., a power level) of the audio signal 107 is lower because the user 101 is speaking softly at night. A second day period (e.g., day-time), a second time of day (e.g., between 6 am and 8 pm), or both, correspond to a higher likelihood that an input audio level (e.g., a power level) of the audio signal 107 is higher because the user 101 is speaking louder.

The external criterion 132 indicates that the single channel mode 180 is to be used when the time sensor data 143 indicates the first day period (e.g., night-time), the first time of day (e.g., between 8 pm and 6 am), or both, and the single channel corresponds to the gain adjuster 120 of FIG. 1. To illustrate, during the single channel mode 180, the gain adjuster 120 corresponding to the higher gain (e.g., the gain 125) is to be activated and the gain adjuster 110 corresponding to the lower gain (e.g., the gain 115) is to be deactivated so that the higher gain is applied when the user 101 is likely to be speaking softly.

In a particular example, the external criterion 132 indicates that the single channel mode 180 is to be used when the time sensor data 143 indicates the second day period (e.g., day-time), the second time of day (e.g., between 6 am and 8 pm), or both, and the single channel corresponds to the gain adjuster 110 of FIG. 1. To illustrate, during the single channel mode 180, the gain adjuster 110 corresponding to the lower gain (e.g., the gain 115) is to be activated and the gain adjuster 120 corresponding to the higher gain (e.g., the gain 125) is to be deactivated so that the lower gain is applied when the user 101 is likely to be speaking louder.

The movement sensor data 145 indicates an amount of detected movement of the device 102. In a particular implementation, the movement sensor 144 includes a global positioning system (GPS) receiver and the movement sensor data 145 indicates a detected GPS location of the device 102. The mode selector 202 determines the amount of detected movement based on a comparison of (e.g., a difference between) a first GPS location of the device 102 at a first time and a second GPS location of the device 102 at a second time. In a particular implementation, the movement sensor 144 includes a camera and the movement sensor data 145 includes image frames representing images captured by the camera. The mode selector 202 determines the amount of detected movement based on a comparison of (e.g., differences between) a first image frame corresponding to an image captured at a first time and a second image frame corresponding to an image captured at a second time. In a particular implementation, the movement sensor 144 includes an accelerometer and the movement sensor data 145 includes accelerometer data. The mode selector 202 determines the amount of detected movement based on a comparison of (e.g., a difference between) first accelerometer data generated at a first time and second accelerometer data generated at a second time.

In a particular aspect, the external criterion 132 includes a movement-based criterion and is based on the amount of detected movement indicated by the movement sensor data 145. For example, detected movement that is more than a threshold movement corresponds to a higher likelihood that an input audio level (e.g., a power level) of the audio signal 107 is higher because the device 102 is moving and is likely to be carried by, or in close proximity to, the user 101. A detected movement that is lower than the threshold movement corresponds to a higher likelihood that an input audio level (e.g., a power level) of the audio signal 107 is lower because the device 102 is not moving and the user 101 could have walked away from the device 102.

In a particular example, the external criterion 132 indicates that the single channel mode 180 is to be used when the movement sensor data 145 indicates that the detected amount of movement is less than a threshold and the single channel corresponds to the gain adjuster 120 of FIG. 1. To illustrate, during the single channel mode 180, the gain adjuster 120 corresponding to the higher gain (e.g., the gain 125) is to be activated and the gain adjuster 110 corresponding to the lower gain (e.g., the gain 115) is to be deactivated so that the higher gain is applied when the user 101 is likely to be farther away from the device 102.

In a particular example, the external criterion 132 indicates that the single channel mode 180 is to be used when the movement sensor data 145 indicates that the detected amount of movement is greater than or equal to the threshold, and the single channel corresponds to the gain adjuster 110 of FIG. 1. To illustrate, during the single channel mode 180, the gain adjuster 110 corresponding to the lower gain (e.g., the gain 115) is to be activated and the gain adjuster 120 corresponding to the higher gain (e.g., the gain 125) is to be deactivated so that the lower gain is applied when the user 101 is likely to be closer to the device 102.

The UP sensor data 147 indicates the detected distance 154 of the user 101. In a particular implementation, the UP sensor 146 includes a camera and the UP sensor data 147 includes image data representing an image of the user 101 captured by the camera. The mode selector 202 determines the detected distance 154 by applying various image distance analysis techniques on the image data. In a particular implementation, the UP sensor 146 includes the microphone 104, and the UP sensor data 147 includes the audio signal 107. The mode selector 202 determines the detected distance 154 by applying various audio distance analysis techniques on the audio signal 107. For example, the mode selector 202 determines the detected distance 154 based on an input signal level (e.g., volume, strength, or power) of the audio signal 107. In a particular aspect, the mode selector 202 uses speech processing techniques to classify user speech as whispered speech, normal speech, or shouting speech and determine the detected distance 154 based on the classification and the input signal level.

In a particular aspect, the external criterion 132 includes a user-proximity criterion that is based on the detected distance 154. For example, the detected distance 154 within a threshold distance corresponds to a higher likelihood that an input audio level (e.g., a power level) of the audio signal 107 is higher because the user 101 is closer to the device 102. The detected distance 154 exceeding the threshold distance corresponds to a higher likelihood that an input audio level (e.g., a power level) of the audio signal 107 is lower because the user 101 is further away from the device 102.

In a particular example, the external criterion 132 indicates that the single channel mode 180 is to be used when the detected distance 154 is greater than or equal to a threshold distance and the single channel corresponds to the gain adjuster 120 of FIG. 1. To illustrate, during the single channel mode 180, the gain adjuster 120 corresponding to the higher gain (e.g., the gain 125) is to be activated and the gain adjuster 110 corresponding to the lower gain (e.g., the gain 115) is to be deactivated so that the higher gain is applied when the user 101 is farther away from the device 102.

In a particular example, the external criterion 132 indicates that the single channel mode 180 is to be used when the detected distance 154 is less than the threshold distance, and the single channel corresponds to the gain adjuster 110 of FIG. 1. To illustrate, during the single channel mode 180, the gain adjuster 110 corresponding to the lower gain (e.g., the gain 115) is to be activated and the gain adjuster 120 corresponding to the higher gain (e.g., the gain 125) is to be deactivated so that the lower gain is applied when the user 101 is closer to the device 102.

In a particular aspect, the mode selection criteria 205 includes resolution rules in cases when multiple criteria are satisfied and indicate conflicting mode selection. In a particular example, the mode selection criteria 205 indicates that the power criterion 233 has higher priority than the performance criterion 231 and that the performance criterion 231 has higher priority than the external criterion 132. To illustrate, the mode selector 202 selects a mode indicated by the higher priority criterion of the power criterion 233, the performance criterion 231, or the external criterion 132 that is satisfied as the selected mode 207.

In a particular aspect, the mode selection criteria 205 includes a combination criterion that is based on two or more of the performance criterion 231, the power criterion 233, or the external criterion 132. For example, a power criterion 233 indicates that the multi-channel mode 182 is to be selected when the device 102 (e.g., a phone) is charging. A first combination criterion indicates that the single channel mode 180 is to be selected in response to determining that the device 102 is not charging (e.g., power criterion) during night-time (e.g., time-based external criterion) or while the phone is moving (e.g., movement based criterion). A second combination criterion indicates that the polling mode 180 is to be selected in response to determining that the device 102 is not charging (e.g., power criterion) during day-time (e.g., time-based external criterion) and the phone is not moving (e.g., movement based criterion).

In FIG. 2, a state diagram 260 illustrates an example of mode selection by the mode selector 202 based on the mode selection criteria 205 including the power criterion 233, the first combination criterion, and the second combination criterion. The gain controller 130 is configured to perform operations corresponding to the selected mode 207. For example, the gain controller 130, in response to an update of the selected mode 207 by the mode selector 202, transitions between the single channel mode 180, the multi-channel mode 182, or the polling mode 184. To illustrate, the mode selector 202 selects the multi-channel mode 182 as the selected mode 207 in response to determining that the power setting 243 indicates that the device 102 is charging. The gain controller 130, in response to determining that the selected mode 207 indicates the multi-channel mode 182, transitions to the multi-channel mode 182. For example, the gain controller 130 receives the gain adjusted signal 111 from the gain adjuster 110 and the gain adjusted signal 121 from the gain adjuster 120 and outputs one of the gain adjusted signal 111 or the gain adjusted signal 121 as the output signal 135, as further described with reference to FIG. 4.

The mode selector 202, in response to determining, while the multi-channel mode 182 is selected, that an update to the power setting 243 indicates that the device 102 is not charging, selects the polling mode 184 as the selected mode 207. The gain controller 130, in response to determining that the selected mode 207 indicates the polling mode 184, transitions from the multi-channel mode 182 to the polling mode 184. The gain controller 130, while the movement sensor data 145 indicates that a detected movement is less than a threshold movement and that the time sensor data 143 indicates that day-time is detected, repeatedly transitions between a polling stage 217 for a polling duration and an inter-polling stage 219 for an inter-polling duration, as further described with reference to FIG. 5.

The mode selector 202, in response to determining, while the polling mode 184 is selected, that an update to the movement sensor data 145 indicates that the detected movement is greater than or equal to the threshold distance, or that an update to the time sensor data 143 indicates that night-time is detected, or both, sets the single channel mode 180 as the selected mode 207. The gain controller 130, in response to determining that the selected mode 207 indicates the single channel mode 180, transitions from the polling mode 184 to the single channel mode 180. The gain controller 130, during the single channel mode 180, activates a single one of the gain adjuster 110 or the gain adjuster 120 and outputs the corresponding gain adjusted signal (e.g., the gain adjusted signal 111 or the gain adjusted signal 121) as the output signal 135, as further described with reference to FIG. 3.

The mode selector 202, in response to determining, while the single channel mode 180 is selected, that an update to the movement sensor data 145 indicates that the detected movement is less than or equal to the threshold distance and that an update to the time sensor data 143 indicates that day-time is detected, sets the polling mode 184 as the selected mode 207. The gain controller 130, in response to determining that the selected mode 207 indicates the polling mode 184, transitions from the single channel mode 180 to the polling mode 184.

The mode selector 202, in response to determining, while in the single channel mode 180 or the polling mode 184, that the power setting 243 indicates that the device 102 is charging, sets the selected mode 207 to multi-channel mode 182. The gain controller 130, in response to determining that the selected mode 207 indicates the multi-channel mode 182, transitions from the single channel mode 180 or the polling mode 184 to the multi-channel mode 182.

The mode selector 202 thus enables the gain controller 130 to dynamically transition between various modes based on the mode selection criteria 205. In a particular aspect, the mode selection criteria 205 are based on default values, configuration settings, user input, or a combination thereof.

Figure 3:
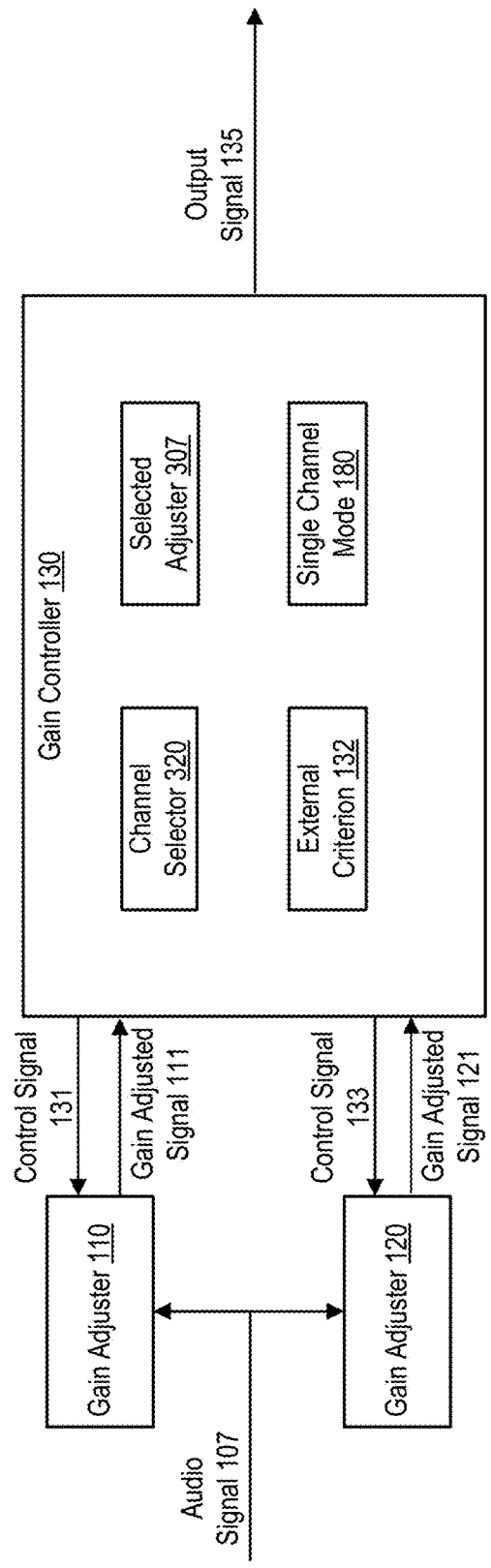
FIG. 3 is a diagram of an illustrative aspect of a system operable to perform audio gain selection, in accordance with some examples of the present disclosure.
Figure 4:
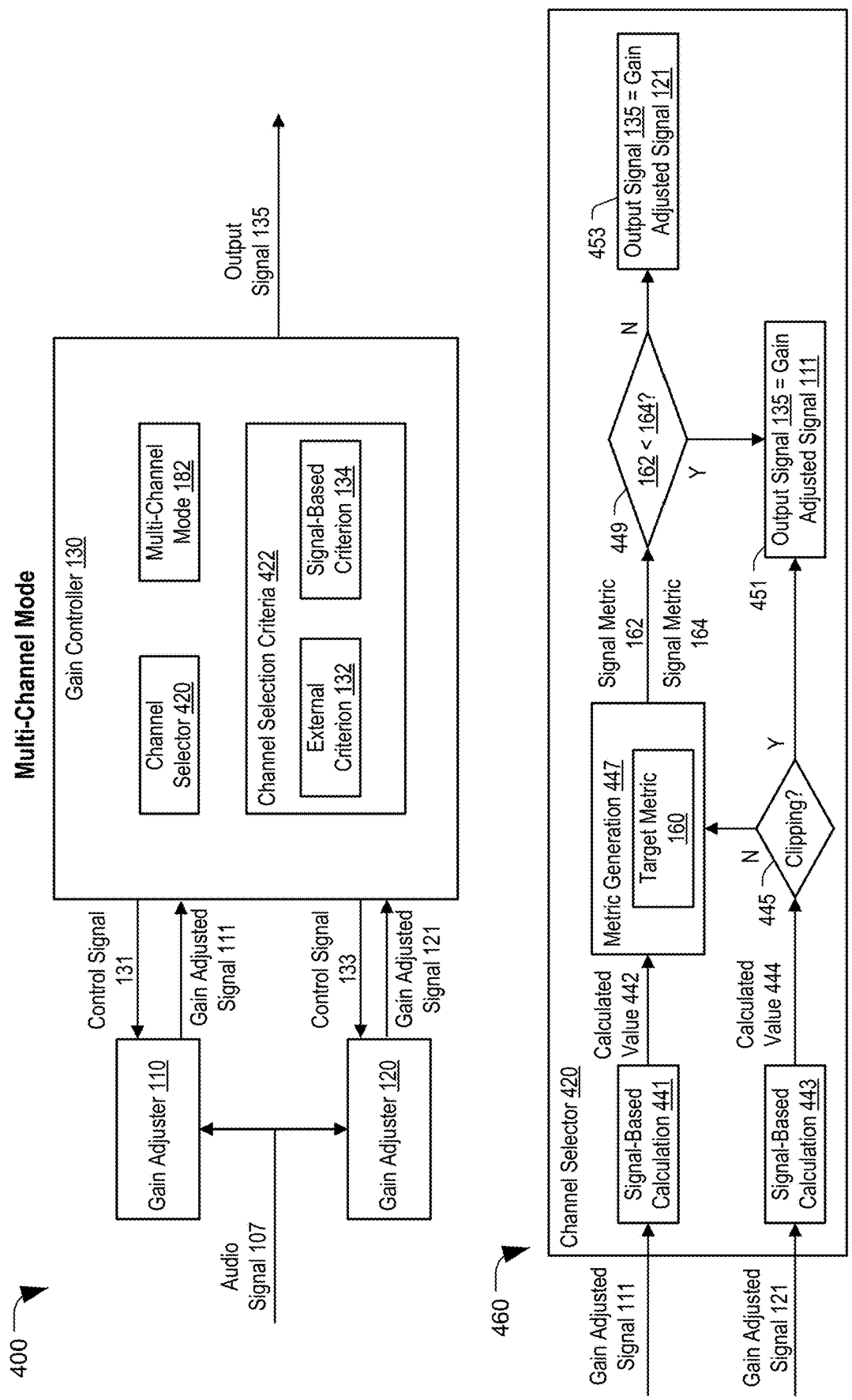
FIG. 4 is a diagram of an illustrative aspect of a system operable to perform audio gain selection, in accordance with some examples of the present disclosure.
Figure 5:
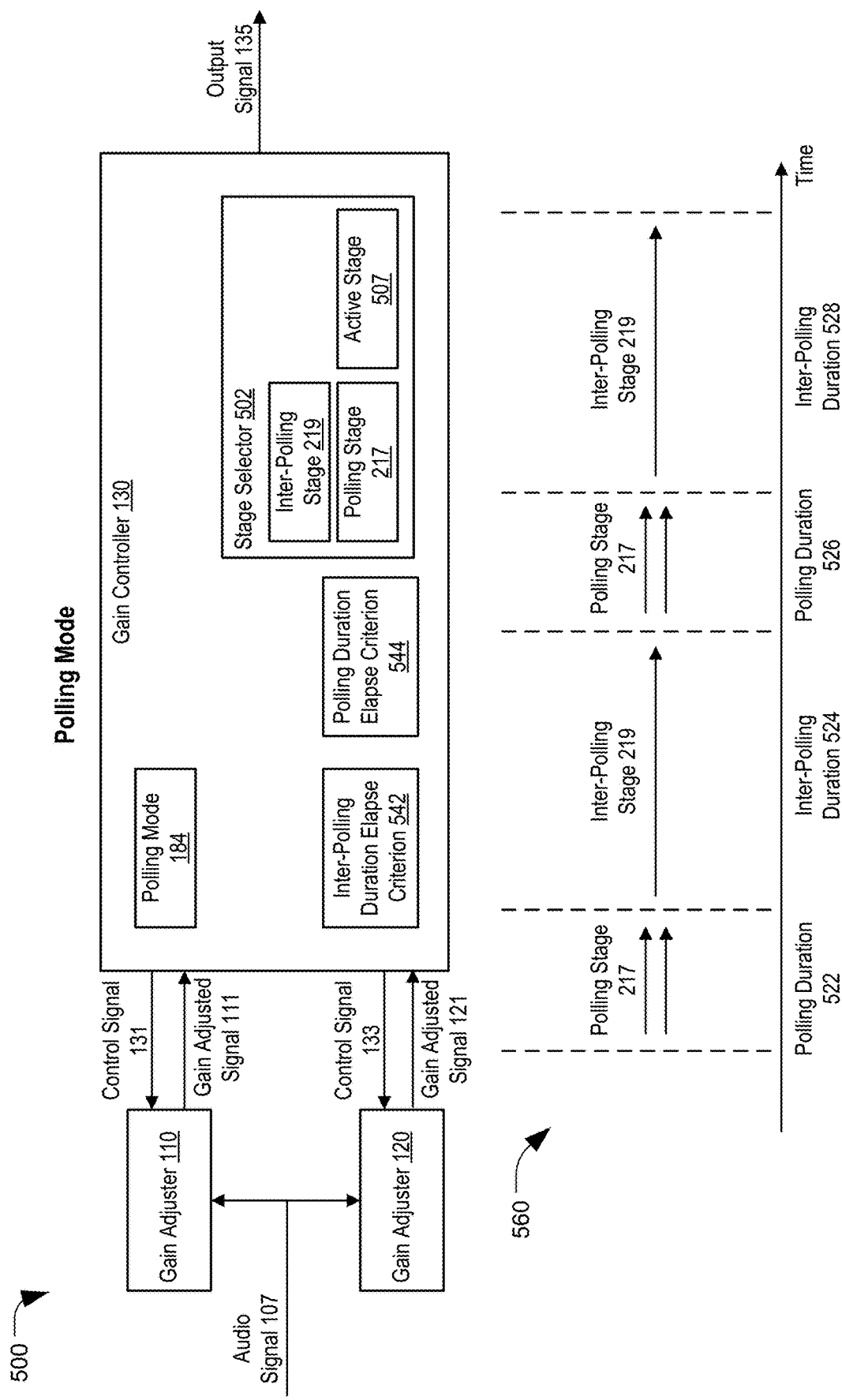
FIG. 5 is a diagram of an illustrative aspect of a system operable to perform audio gain selection, in accordance with some examples of the present disclosure.

FIGS. 3-5 provide examples of operations of the gain controller 130 during various modes. FIG. 3 provides an example of operations of the gain controller 130 during the single channel mode 180. FIG. 4 provides an example of operations of the gain controller 130 during the multi-channel mode 182. FIG. 5 provides an example of operations of the gain controller 130 during the polling mode 184.

Referring to FIG. 3, a system operable to perform audio gain selection is shown and generally designated 300. In a particular aspect, the system 100 of FIG. 1 includes one or more components of the system 300. The system 300 includes a channel selector 320 that is configured to, during the single channel mode 180, determine one of the gain adjuster 110 or the gain adjuster 120 as a selected adjuster 307.

The channel selector 320 is configured to, during the single channel mode 180, determine the selected adjuster 307 based on the external criterion 132 (e.g., a time-based criterion, a movement-based criterion, a proximity-based criterion, or a combination thereof). For example, the channel selector 320 selects the gain adjuster 110 as the selected adjuster 307 based at least in part on determining that the time sensor data 143 indicates a first day period (e.g., day-time), a first time of the day (e.g., between 6 AM and 8 PM), or both. Alternatively the channel selector 320 selects the gain adjuster 120 as the selected adjuster 307 based at least in part on determining that the time sensor data 143 indicates a second day period (e.g., night-time), a second time of the day (e.g., between 8 PM and 6 AM), or both.

In a particular example, the channel selector 320 selects the gain adjuster 110 as the selected adjuster 307 based at least in part on determining that the movement sensor data 145 indicates a detected movement that is greater than or equal to a movement threshold. Alternatively the channel selector 320 selects the gain adjuster 120 as the selected adjuster 307 based on at least in part on determining that the movement sensor data 145 indicates a detected movement that is less than the movement threshold.

In a particular example, the channel selector 320 selects the gain adjuster 110 as the selected adjuster 307 based at least in part on determining that the UP sensor data 147 indicates the detected distance 154 that is within (e.g., less than) a distance threshold. Alternatively the channel selector 320 selects the gain adjuster 120 as the selected adjuster 307 based on at least in part on determining that the detected distance 154 is greater than or equal to the distance threshold.

The gain controller 130, during the single channel mode 180, activates the selected adjuster 307 and deactivates the remaining adjuster. In a particular example, the selected adjuster 307 includes the gain adjuster 110. The gain controller 130 sends a control signal 131 having a first logical value (e.g., 1) to the gain adjuster 110 to activate the gain adjuster 110 and sends a control signal 133 having a second logical value (e.g., 0) to the gain adjuster 120 to deactivate the gain adjuster 120. The gain controller 130 outputs the gain adjusted signal 111 from the gain adjuster 110 as the output signal 135.

In another particular example, the selected adjuster 307 includes the gain adjuster 120. The gain controller 130 sends a control signal 131 having a second logical value (e.g., 0) to the gain adjuster 110 to deactivate the gain adjuster 110 and sends a control signal 131 having a first logical value (e.g., 1) to the gain adjuster 120 to activate the gain adjuster 120. The gain controller 130 outputs the gain adjusted signal 121 from the gain adjuster 120 as the output signal 135.

The gain controller 130 thus conserves power by activating a single gain adjuster during the single channel mode 180 and deactivating the remaining gain adjuster. For example, the deactivated gain adjuster consumes reduced (e.g., no) power resources.

Referring to FIG. 4, a system operable to perform audio gain selection is shown and generally designated 400. In a particular aspect, the system 100 of FIG. 1 includes one or more components of the system 400. The system 400 includes a channel selector 420 that is configured to, during the multi-channel mode 182, select one of the gain adjusted signal 111 or the gain adjusted signal 121 as the output signal 135.

During the multi-channel mode 182, the gain adjuster 110 and the gain adjuster 120 are activated. In a particular aspect, the gain controller 130 provides a control signal 131 having a first logical value (e.g., 1) to the gain adjuster 110 to activate the gain adjuster 110, and provides a control signal 133 having a first logical value (e.g., 1) to the gain adjuster 120 to activate the gain adjuster 120. In a particular implementation, the gain adjuster 110 and gain adjuster 120 are activated during the multi-channel mode 182 independently of a control signal (e.g., always activated). The gain controller 130 receives the gain adjusted signal 111 from the gain adjuster 110 and receives the gain adjusted signal 121 from the gain adjuster 120. The channel selector 420 is configured to select one of the gain adjusted signal 111 or the gain adjusted signal 121 based on one or more channel selection criteria 422. The channel selection criteria 422 includes the external criterion 132, the signal-based criterion 134, or a combination thereof.

In a particular example, the channel selector 420 selects one of the gain adjusted signal 111 or the gain adjusted signal 121 based on the external criterion 132 in a similar manner as used by the channel selector 320, as described with reference to FIG. 3, to select one of the gain adjuster 110 or the gain adjuster 120. For example, the channel selector 420 selects the gain adjusted signal 111 as the output signal 135 based at least in part on determining that the time sensor data 143 indicates a first day period (e.g., day-time), a first time of the day (e.g., between 6 AM and 8 PM), or both. Alternatively the channel selector 420 selects the gain adjusted signal 121 as the output signal 135 based at least in part on determining that the time sensor data 143 indicates a second day period (e.g., night-time), a second time of the day (e.g., between 8 PM and 6 AM), or both.

In a particular example, the channel selector 420 selects the gain adjusted signal 111 as the output signal 135 based at least in part on determining that the movement sensor data 145 indicates a detected movement that is greater than or equal to a movement threshold. Alternatively the channel selector 420 selects the gain adjusted signal 121 as the output signal 135 based on at least in part on determining that the movement sensor data 145 indicates a detected movement that is less than the movement threshold.

In a particular example, the channel selector 420 selects the gain adjusted signal 111 as the output signal 135 based at least in part on determining that the UP sensor data 147 indicates the detected distance 154 that is within (e.g., less than) a distance threshold. Alternatively the channel selector 420 selects the gain adjusted signal 121 as the output signal 135 based on at least in part on determining that the detected distance 154 is greater than or equal to the distance threshold.

In FIG. 4, an example 460 of operations of the channel selector 420 to select one of the gain adjusted signal 111 or the gain adjusted signal 121 based on the signal-based criterion 134 is shown. In a particular aspect, the channel selector 420 performs a signal-based calculation 441 (e.g., a root-mean-square (RMS) calculation) based on the gain adjusted signal 111 to generate a calculated value 442 (e.g., a RMS value). The channel selector 420 performs a signal-based calculation 443 (e.g., a RMS calculation) based on the gain adjusted signal 121 to generate a calculated value 444 (e.g., a RMS value). The channel selector 420 determines, at 445, whether the calculated value 444 indicates audio clipping. For example, the channel selector 420 determines that the calculated value 444 indicates audio clipping in response to determining that the calculated value 444 indicates that an input audio level of the gain adjusted signal 121 is greater than a threshold supported audio level.

The channel selector 420, in response to determining that the calculated value 444 does not indicate clipping, at 445, performs metric generation 447. For example, the channel selector 420 generates a signal metric 162 based on a comparison of (e.g., an absolute difference between) the calculated value 442 and the target metric 160 (e.g., signal metric 162=|calculated value 442−target metric 160|). To illustrate, the signal metric 162 indicates how close the calculated value 442 (e.g., a RMS value) is to the target metric 160 (e.g., a target RMS value). Similarly, the channel selector 420 generates a signal metric 164 based on a comparison of (e.g., an absolute difference between) the calculated value 444 and the target metric 160 (e.g., signal metric 164=|calculated value 444−target metric 160|). To illustrate, the signal metric 164 indicates how close the calculated value 444 (e.g., a RMS value) is to the target metric 160 (e.g., a target RMS value).

The channel selector 420 compares the signal metric 162 and the signal metric 164, at 449. The channel selector 420 selects the gain adjusted signal 121 as the output signal 135 in response to determining that the signal metric 162 is greater than or equal to the signal metric 164. For example, the channel selector 420 selects the gain adjusted signal 121 in response to determining that the signal metric 164 is closer (as compared to the signal metric 164) to the target metric 160 or that the signal metric 164 is the same distance as the signal metric 162 from the target metric 160. Alternatively, the channel selector 420 selects the gain adjusted signal 111 as the output signal 135 in response to determining that the signal metric 162 is less than the signal metric 164, at 449, or determining that the calculated value 444 indicates clipping, at 445. For example, the channel selector 420 selects the gain adjusted signal 111 in response to determining that the signal metric 162 is closer (as compared to the signal metric 164) to the target metric 160.

In a particular example, the channel selector 420 selects the gain adjusted signal 111 having the signal metric 162 that is likely closer (as compared to the signal metric 164) to the target metric 160 independently of performing the metric generation 447 to determine the signal metric 162 or the signal metric 164. To illustrate, in cases where clipping is detected in the gain adjusted signal 121, a signal metric 164 (if determined for the gain adjusted signal 121) would likely be far from the target metric 160. A signal metric 162 (if determined for the gain adjusted signal 111) would likely be closer to the target metric 160 because the gain adjusted signal 111 corresponds to a lower gain applied to the audio signal 107 and is less likely to indicate clipping. The channel selector 420 can thus select the gain adjusted signal 111 as the output signal 135 independently of performing the metric generation 447 in response to determining that clipping is detected in the gain adjusted signal 121. The signal-based criterion 134 is thus based on whether the signal metric 162 or the signal metric 164 is closer to the target metric 160. In a particular aspect, the target metric 160 indicates properties (e.g., a RMS value) that are preferred in an audio signal to improve performance of the audio processing operation 152. Selecting an audio signal that is closer to the target metric 160 is thus likely to improve performance of the audio processing operation 152.

The gain controller 130 thus enables selection of one of the gain adjusted signal 111 received from the gain adjuster 110 or the gain adjusted signal 121 received from the gain adjuster 120. The selection is based on the external criterion 132, the signal-based criterion 134, or a combination thereof.

Referring to FIG. 5, a system operable to perform audio gain selection is shown and generally designated 500. In a particular aspect, the system 100 of FIG. 1 includes one or more components of the system 500.

The system 500 includes a stage selector 502 that is configured to, during the polling mode 184, select one of the polling stage 217 or the inter-polling stage 219 as an active stage 507. For example, the stage selector 502 initializes the active stage 507 to the polling stage 217. The gain controller 130 enters the polling stage 217 in response to determining that the active stage 507 indicates the polling stage 217. In a particular aspect, the gain controller 130 initializes a polling timer upon entering the polling stage 217.

The gain adjuster 110 and the gain adjuster 120 are activated during the polling stage 217. To illustrate, the gain controller 130 activates the gain adjuster 110 by providing the control signal 131 having a first logical value (e.g., 1) to the gain adjuster 110, activates the gain adjuster 120 by providing the control signal 133 having a first logical value (e.g., 1) to the gain adjuster 120, or both. During the polling stage 217, the gain controller 130 performs operations similar to operations of the multi-channel mode 182, described with reference to FIG. 4. For example, the gain controller 130 selects, based on the channel selection criteria 422, one of the gain adjusted signal 111 received from the gain adjuster 110 or the gain adjusted signal 121 from the gain adjuster 120, as described with reference to the channel selector 420 of FIG. 4. The gain controller 130, during a polling duration 522 of the polling stage 217, outputs the selected one of the gain adjusted signal 111 or the gain adjusted signal 121 as the output signal 135. In FIG. 5, an example of the polling duration 522 of the polling stage 217 is shown in a timeline 560. Double arrows are used to represent that both the gain adjusted signal 111 and the gain adjusted signal 121 are received by the gain controller 130.

In a particular aspect, the gain controller 130, during the polling duration 522, evaluates the channel selection criteria 422 multiple times to selectively update the selected one of the gain adjusted signal 111 or the gain adjusted signal 121, and output the selected one of the gain adjusted signal 111 or the gain adjusted signal 121 as the output signal 135. In a particular example, the gain controller 130 outputs the gain adjusted signal 111 as the output signal 135 during a first portion of the polling duration 522, and outputs the gain adjusted signal 121 as the output signal 135 during a second portion of the polling duration 522.

The stage selector 502, while in the polling stage 217 and in response to determining that a polling duration elapse criterion 544 is satisfied, selects the inter-polling stage 219 as the active stage 507. For example, the stage selector 502 determines that the polling duration elapse criterion 544 is satisfied in response to determining that the polling timer has expired, that changes in audio conditions are unlikely, or both. To illustrate, the stage selector 502 determines that changes in audio conditions are unlikely in response to determining that the movement sensor data 145 has not indicated significant movement (e.g., greater than a movement threshold) for a threshold time, that the time sensor data 143 indicates a time in a first range (e.g., between 8 PM and 6 AM), that the time sensor data 143 indicates a particular day period (e.g., night-time), that the UP sensor data 147 indicates the detected distance 154 that is greater than a threshold distance, or a combination thereof.

The gain controller 130, during the polling mode 184 and in response to determining that the active stage 507 indicates the inter-polling stage 219, transitions from the polling stage 217 to the inter-polling stage 219. In a particular implementation, the gain controller 130 identifies a selected gain adjuster for the inter-polling stage 219. For example, the gain controller 130 identifies the gain adjuster 110 as the selected gain adjuster in response to determining that, at the end of the polling stage 217, the output signal 135 includes the gain adjusted signal 111. Alternatively, the gain controller 130 identifies the gain adjuster 120 as the selected gain adjuster in response to determining that, at the end of the polling stage 217, the output signal 135 includes the gain adjusted signal 121. In a particular aspect, the gain controller 130 initializes an inter-polling timer upon entering the inter-polling stage 219.

During the inter-polling stage 219 of the polling mode 184, a single one of the gain adjuster 110 or the gain adjuster 120 (e.g., the active gain adjuster) is activate and any remaining gain adjuster is deactivated. In a particular implementation, the selected gain adjuster at the end of the polling stage 217 remains activated during an inter-polling duration 524 of the inter-polling stage 219 and any remaining gain adjuster is deactivated during the inter-polling duration 524. An example of the inter-polling duration 524 is shown in the timeline 560. A single arrow is used to represent that a single one of the gain adjusted signal 111 and the gain adjusted signal 121 is received by the gain controller 130. In a particular example, the gain controller 130, in response to determining that the selected gain adjuster includes the gain adjuster 110, sends the control signal 133 including a second logical value (e.g., 0) to deactivate the gain adjuster 120. Alternatively, the gain controller 130, in response to determining that the selected gain adjuster includes the gain adjuster 120, sends the control signal 131 including a second logical value (e.g., 0) to deactivate the gain adjuster 110. The gain controller 130, while in the inter-polling stage 219 of the polling mode 184, outputs the gain adjusted signal 111 or the gain adjusted signal 121 received from the selected gain adjuster during the inter-polling duration 524, and refrains from switching between the gain adjusted signal 111 and the gain adjusted signal 121 during the inter-polling duration 524.

In a particular implementation, the gain controller 130, during the inter-polling stage 219 of the polling mode 184, performs operations similar to the operations of the single channel mode 180 described with reference to FIG. 3. For example, the gain controller 130 selects, based on the external criterion 132, one of the gain adjuster 110 or the gain adjuster 120, as described with reference to the channel selector 320 of FIG. 3. The gain controller 130, while in the inter-polling stage 219 of the polling mode 184, outputs one of the gain adjusted signal 111 or the gain adjusted signal 121 from the selected one of the gain adjuster 110 or the gain adjuster 120 as the output signal 135 during the inter-polling duration 524.

In a particular aspect, the gain controller 130, during the inter-polling duration 524, evaluates the external criterion 132 multiple times to selectively update the selected one of the gain adjuster 110 or the gain adjuster 120, and output one of the gain adjusted signal 111 or the gain adjusted signal 121 from the selected one of the gain adjuster 110 or the gain adjuster 120 as the output signal 135. In a particular example, the gain controller 130 outputs the gain adjusted signal 111 as the output signal 135 during a first portion of the inter-polling duration 524, and outputs the gain adjusted signal 121 as the output signal 135 during a second portion of the inter-polling duration 524.

The stage selector 502, while in the inter-polling stage 219 and in response to determining that an inter-polling duration elapse criterion 542 is satisfied, selects the polling stage 217 as the active stage 507. For example, the stage selector 502 determines that the inter-polling duration elapse criterion 542 is satisfied in response to determining that the inter-polling timer has expired, that changes in audio conditions are likely, or both. To illustrate, the stage selector 502 determines that changes in audio conditions are likely in response to determining that the movement sensor data 145 indicates detected movement that is greater than or equal to a movement threshold, that the time sensor data 143 indicates a time in a particular range (e.g., between 6 AM and 8 PM), that the time sensor data 143 indicates a particular day period (e.g., day-time), that the UP sensor data 147 indicates the detected distance 154 that is less than or equal to a threshold distance, or a combination thereof. The gain controller 130, during the polling mode 184 and in response to determining that the active stage 507 indicates the polling stage 217, transitions from the inter-polling stage 219 to the polling stage 217.

In a particular aspect, the gain controller 130 repeatedly transitions between the polling stage 217 and the inter-polling stage 219 while in the polling mode 184. In a particular example, the gain controller 130 is in the polling stage 217 during the polling duration 522, in the inter-polling stage 219 during the inter-polling duration 524, in the polling stage 217 during a polling duration 526, in the inter-polling stage 219 during a inter-polling duration 528, or a combination thereof.

In a particular implementation, a polling duration has a first fixed length (e.g., based on the polling timer) and an inter-polling duration has a second fixed length (e.g., based on the inter-polling timer) that is greater than the first fixed length. For example, the polling duration 522 has the same length as the polling duration 526, and the inter-polling duration 524 has the same length as the inter-polling duration 528. In a particular aspect, the inter-polling duration 524 is greater than the polling duration 522.

In a particular implementation, the polling duration, the inter-polling duration, or both, can vary dynamically when the polling duration elapse criterion 544 is based on factors in addition to or different from the polling timer, the inter-polling duration elapse criterion 542 is based on factors in addition to or different from the inter-polling timer, or both. For example, each of the polling duration 522, the inter-polling duration 524, the polling duration 526, or the inter-polling duration 528 is greater than, the same as, or less than another of the polling duration 522, the inter-polling duration 524, the polling duration 526, or the inter-polling duration 528.

The gain controller 130 thus enables power conservation by activating a single gain adjuster and deactivating any remaining gain adjusters during at least a first portion of a duration of the polling mode 184. The gain controller 130 balances power conservation with performance by activating multiple gain adjusters during a second portion of the polling mode 184 to compare the gain adjusted signals and to select a best-performing gain adjusted signal for use during the first portion.

Figure 6:
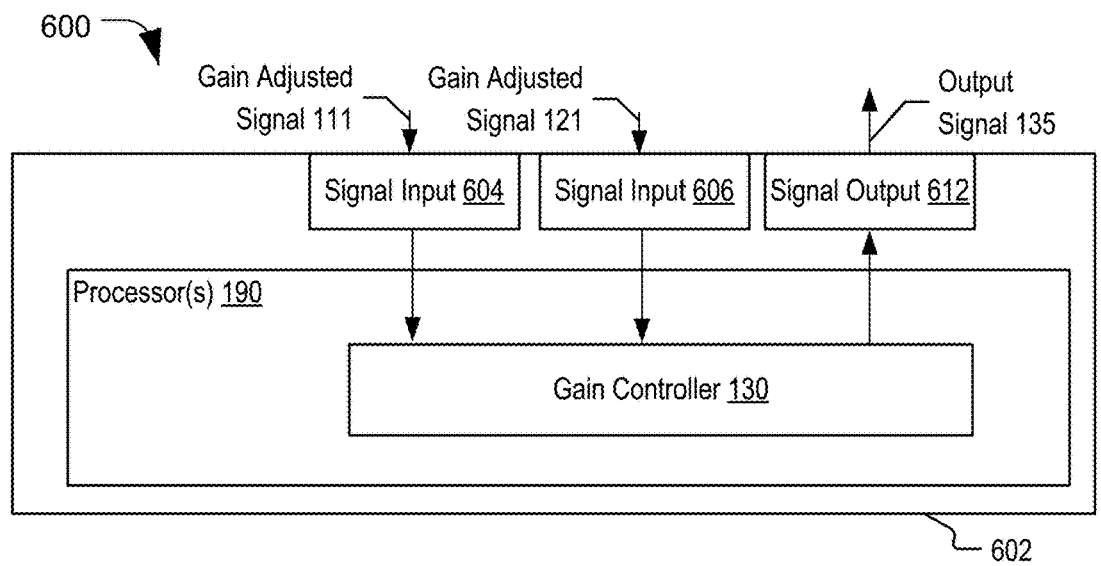
FIG. 6 illustrates an example of an integrated circuit that includes a gain controller, in accordance with some examples of the present disclosure.
Figure 10:
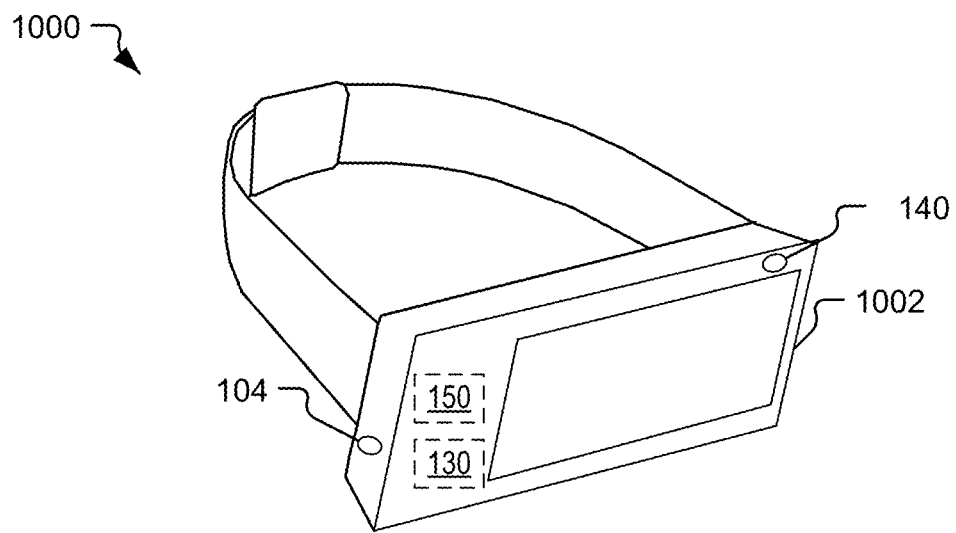
FIG. 10 is a diagram of a wearable electronic device that includes a gain controller, in accordance with some examples of the present disclosure.
Figure 11:
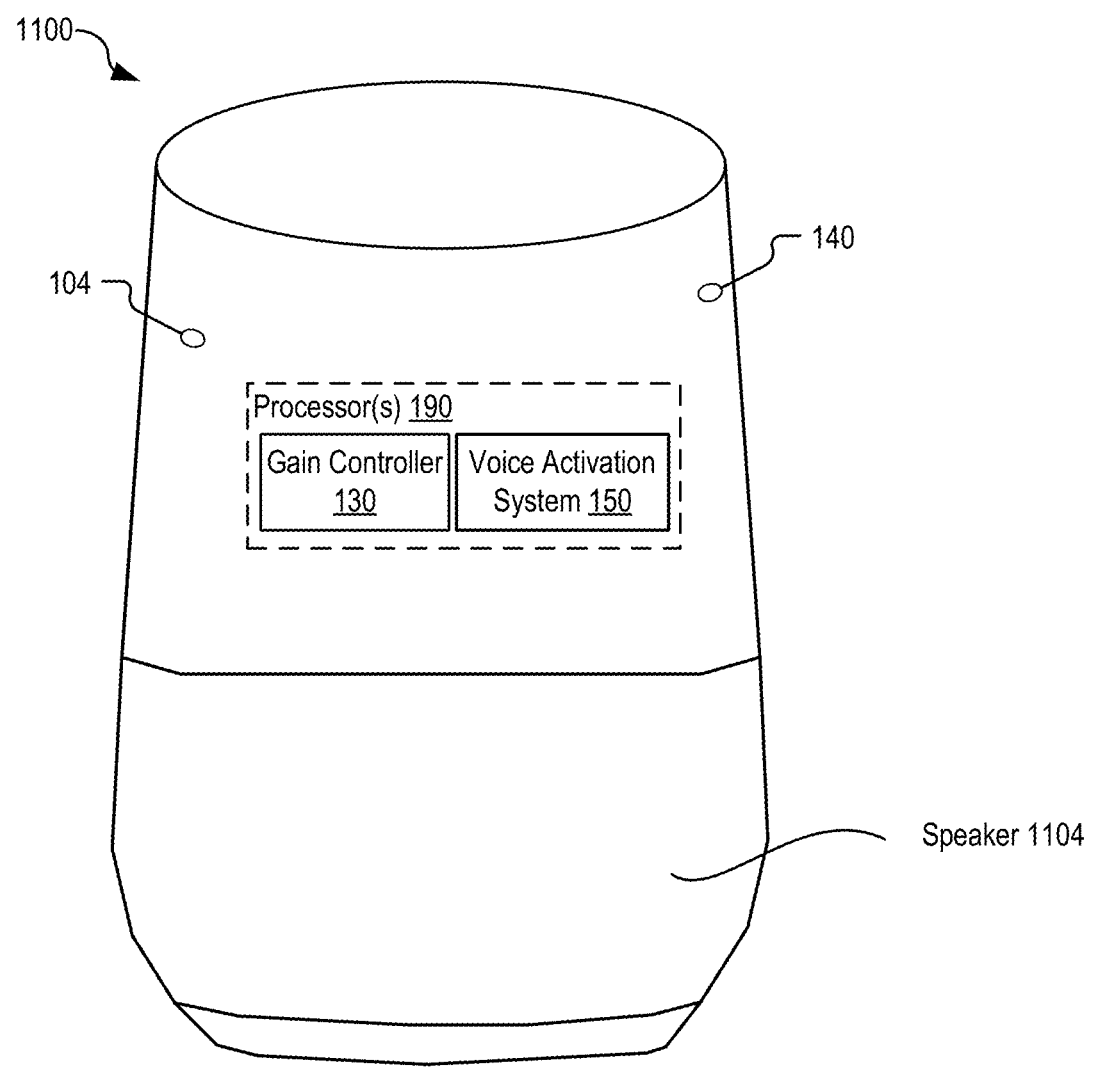
FIG. 11 is a diagram of a voice-controlled speaker system that includes a gain controller, in accordance with some examples of the present disclosure.
Figure 13:
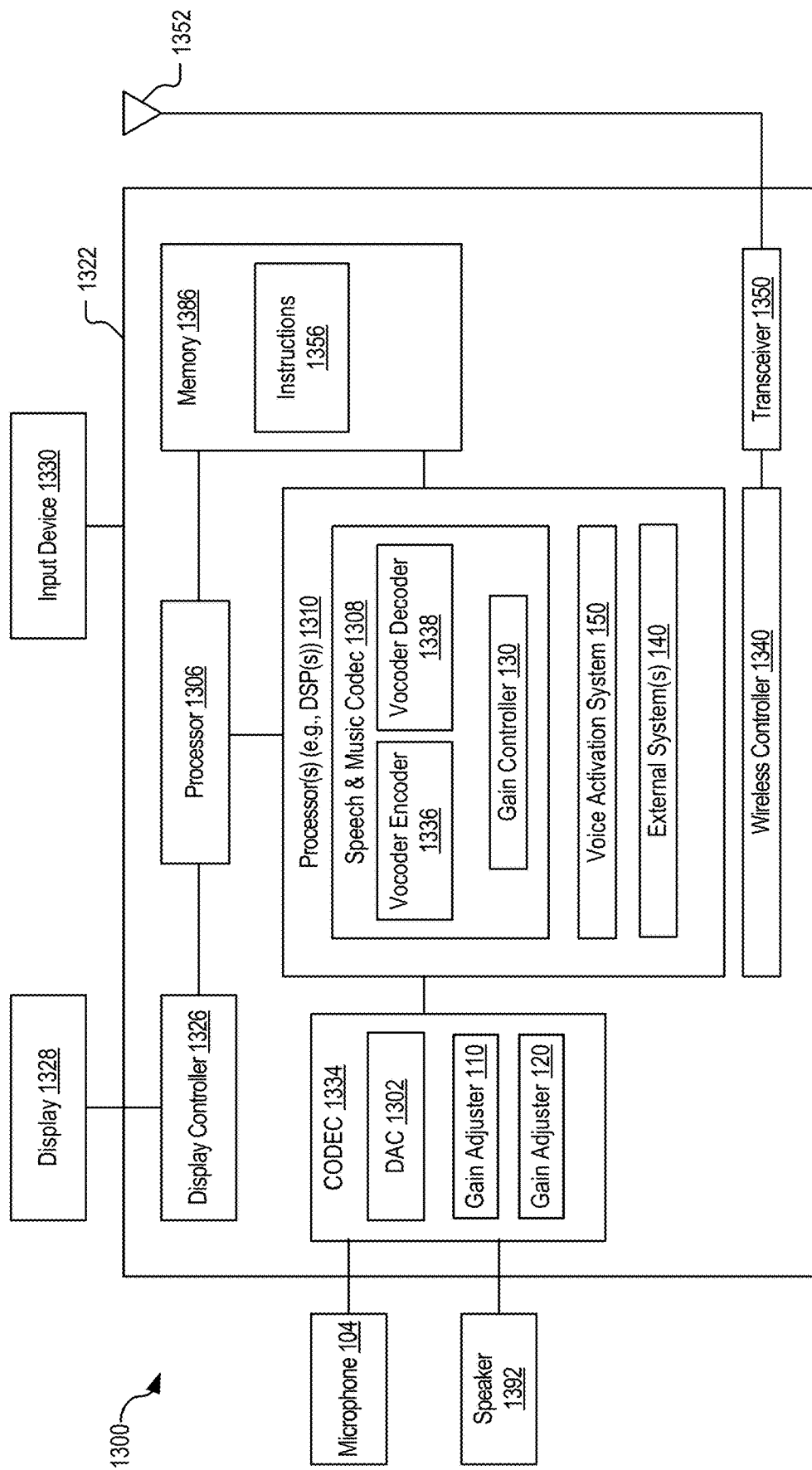
FIG. 13 is a block diagram of a particular illustrative example of a device that is operable to perform audio gain selection, in accordance with some examples of the present disclosure.

FIG. 6 depicts an implementation 600 of the device 102 as an integrated circuit 602 that includes the one or more processors 190. The integrated circuit 602 also includes a signal input 604 and a signal input 606, such as bus interfaces, to enable the gain adjusted signal 111 and the gain adjusted signal 121 to be received from the gain adjuster 110 and the gain adjuster 120, respectively. For example, the signal input 604 receives the gain adjusted signal 111 from the gain adjuster 110 and provides the gain adjusted signal 111 to the gain controller 130. Similarly, the signal input 606 receives the gain adjusted signal 121 from the gain adjuster 120 and provides the gain adjusted signal 121 to the gain controller 130. The integrated circuit 602 also includes a signal output 612, such as a bus interface, to enable sending of the output signal 135 (e.g., to the voice activation system 150 of FIG. 1). The integrated circuit 602 enables implementation of audio gain selection as a component in a system that includes a microphone, such as a vehicle as depicted in FIG. 7 or 8, a virtual reality or augmented reality headset as depicted in FIG. 9, a wearable electronic device as depicted in FIG. 10, a voice-controlled speaker system as depicted in FIG. 11, or a wireless communication device as depicted in FIG. 13.

Figure 7:
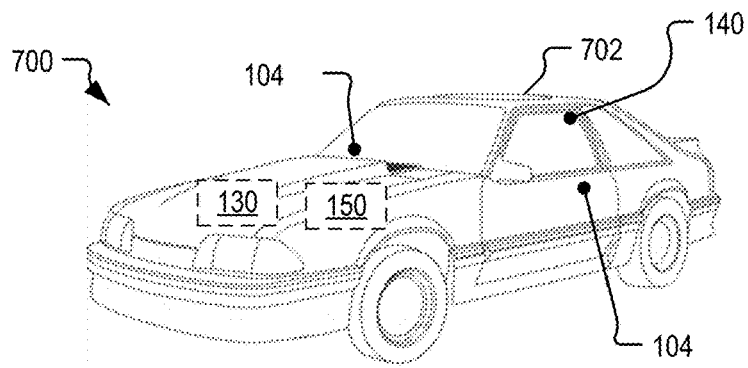
FIG. 7 is a diagram of a first example of a vehicle that includes a gain controller, in accordance with some examples of the present disclosure.

FIG. 7 depicts an implementation 700 in which the device 102 corresponds to, or is integrated within, a vehicle 702, illustrated as a car. In some implementations, audio gain selection can be performed based on an audio signal received from interior microphones (e.g., the microphone 104), such as for a voice command from a passenger, based on an audio signal received from external microphones (e.g., the microphone 104), such as an authorized user of the vehicle, or both. In a particular implementation, the external system 140 is located within or integrated into the vehicle 702. The gain controller 130 provides the output signal 135 of FIG. 1 to the voice activation system 150. For example, the voice activation system 150 initiates one or more operations of the vehicle 702 based on one or more keywords (e.g., "unlock", "start engine", "play music", "display weather forecast", or another voice command) detected in the output signal 135. In a particular aspect, the audio gain selection improves speech detection by the vehicle 802 by outputting the gain adjusted signal 111 or the gain adjusted signal 121 based on a status of the vehicle 802. For example, the gain controller 130 selects the gain adjusted signal 111 (corresponding to the lower gain) when the vehicle 702 is traveling at high speeds and the user 101 is likely to be speaking over highway noises (e.g., wind noise or engine acceleration noise). Selecting the gain adjusted signal 111 corresponding to the lower gain reduces a likelihood of saturation because of the highway noises. As another example, the gain controller 130 selects the gain adjusted signal 121 (corresponding to the higher gain) when the vehicle is stationary (e.g., idling or engine is off) and the user 101 is likely to be speaking softly. Selecting the gain adjusted signal 121 corresponding to the higher gain increases a likelihood of speech recognition when the user 101 is speaking softly.

Figure 8:
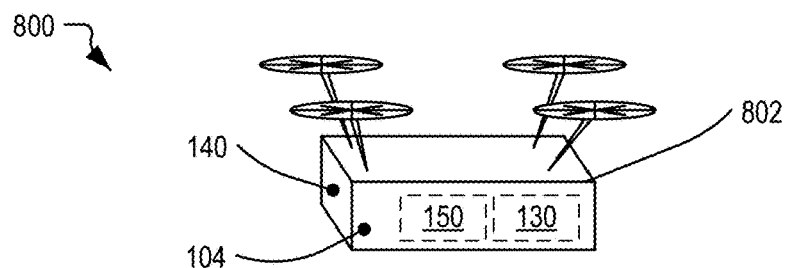
FIG. 8 is a diagram of a second example of a vehicle that includes a gain controller, in accordance with some examples of the present disclosure.

FIG. 8 depicts another implementation 800 in which the device 102 corresponds to or is integrated within a vehicle 802, illustrated as a manned or unmanned aerial device (e.g., a package delivery drone). Audio gain selection can be performed based on an audio signal received from one or more microphones (e.g., the microphone 104) of the vehicle 802, such as for delivery instructions from an authorized user of the vehicle 802. For example, the audio gain selection improves speech detection by the vehicle 802.

Figure 9:
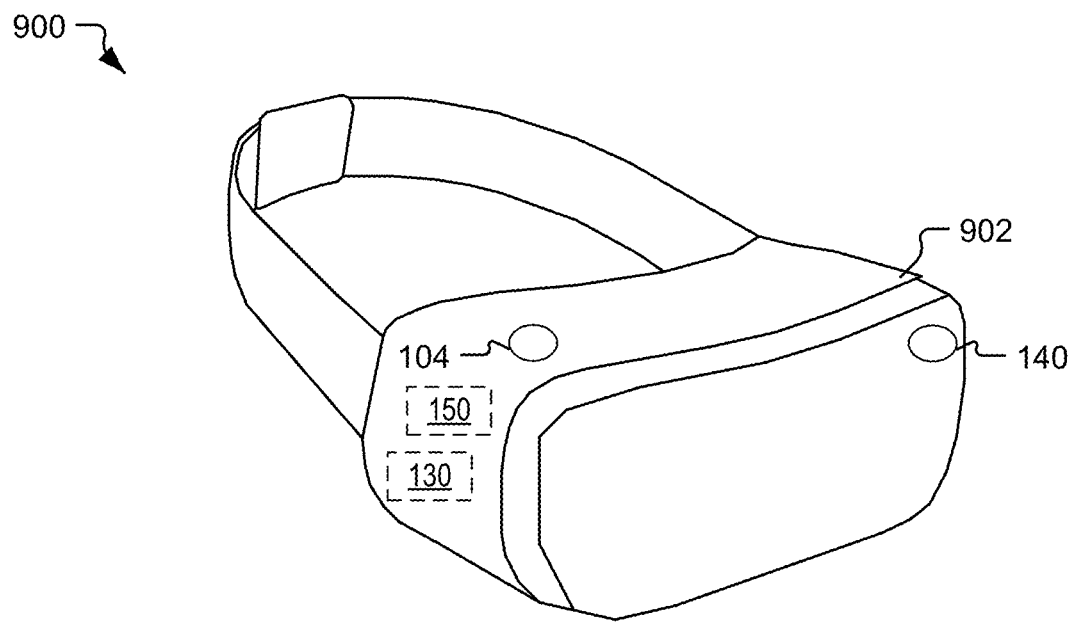
FIG. 9 is a diagram of a headset, such as a virtual reality or augmented reality headset, that includes a gain controller, in accordance with some examples of the present disclosure.

FIG. 9 depicts an implementation 900 in which the device 102 is a portable electronic device that corresponds to a virtual reality, augmented reality, or mixed reality headset 902. The gain controller 130, the microphone 104, the voice activation system 150, the external system 140, or a combination thereof, are integrated into the headset 902. Audio gain selection can be performed based on an audio signal received from the microphone 104 of the headset 902. For example, the audio gain selection can improve speech detection by the headset 902. A visual interface device is positioned in front of the user's eyes to enable display of augmented reality or virtual reality images or scenes to the user while the headset 902 is worn. In a particular example, the gain controller 130 is configured to display a notification indicating speech detected in the audio signal. In a particular aspect, the audio gain selection improves speech detection by the headset 902 by outputting the gain adjusted signal 111 or the gain adjusted signal 121 based on a status (e.g., a virtual game status) of the headset 902. For example, the gain controller 130 selects the gain adjusted signal 121 (corresponding to the higher gain) during parts of game play in an immersive environment in which the wearer is likely to speak softly (e.g., when the player is trying to avoid detection by opponents in the game). The gain controller 130 selects the gain adjusted signal 111 (corresponding to the lower gain) when the wearer is likely to speak loudly (e.g., during a noisy or exciting scenario in which the wearer is active).

FIG. 10 depicts an implementation 1000 in which the device 102 is a portable electronic device that corresponds to a wearable electronic device 1002, illustrated as a "smart watch." The gain controller 130, the microphone 104, the voice activation system 150, the external system 140, or a combination thereof, are integrated into the wearable electronic device 1002. Audio gain selection can be performed based on an audio signal received from the microphone 104 of the wearable electronic device 1002. The audio gain selection improves speech detection by the wearable electronic device 1002. For example, the gain controller 130 selects the gain adjusted signal 111 (corresponding to the lower gain) when the wearable electronic device 1002 is closer to the user's ears (e.g., the wearable electronic device 1002 is on a wrist that is closer to the user's face because the user is checking the time). The gain controller 130 selects the gain adjusted signal 121 (corresponding to the higher gain) when the wearable electronic device 1002 is further away from the user's ears (e.g., the wearable electronic device 1002 is on a wrist and the user's arm is extended). The wearable electronic device 1002 includes a display screen that is configured to display a notification based on speech detected by the wearable electronic device 1002. In a particular example, the wearable electronic device 1002 includes a haptic device that provides a haptic notification (e.g., vibrates) in response to detection of a keyword. The haptic notification can cause a user to look at the wearable electronic device 1002 to see a displayed notification indicating that the keyword is detected. The wearable electronic device 1002 can thus alert a user with a hearing impairment or a user wearing a headset that the keyword is detected.

FIG. 11 is an illustrative example of an audio device that includes a wireless speaker and voice activated device 1100. The wireless speaker and voice activated device 1100 can have wireless network connectivity and is configured to execute an assistant operation. The processor 190, the gain controller 130, the microphone 104, the voice activation system 150, the external system 140, or a combination thereof, are included in the wireless speaker and voice activated device 1100. The wireless speaker and voice activated device 1100 also includes a speaker 1104. During operation, in response to receiving a verbal command, the wireless speaker and voice activated device 1100 can execute assistant operations, such as via execution of the voice activation system 150 (e.g., an integrated assistant application). The assistant operations can include adjusting a temperature, playing music, turning on lights, etc. For example, the assistant operations are performed responsive to receiving a command after a keyword (e.g., "hello assistant"). Audio gain selection can be performed based on an audio signal received from the microphone 104 of the wireless speaker and voice activated device 1100. For example, the audio gain selection improves speech detection by the wireless speaker and voice activated device 1100.

Figure 12:
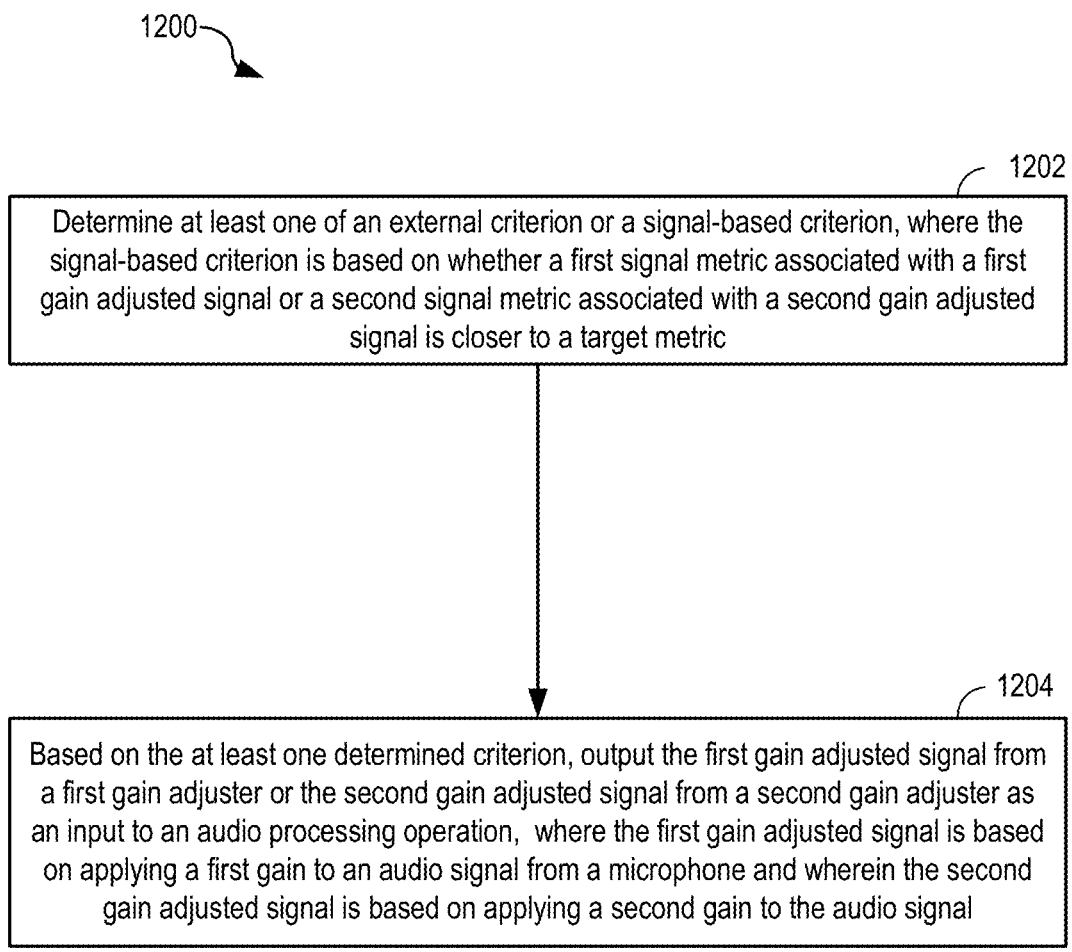
FIG. 12 is diagram of a particular implementation of a method of audio gain selection that may be performed by the device of FIG. 1, in accordance with some examples of the present disclosure.

Referring to FIG. 12, a particular implementation of a method 1200 of audio gain selection is shown. In a particular aspect, one or more operations of the method 1200 are performed by at least one of the gain controller 130, the processor 190, the device 102, the system 100 of FIG. 1, or a combination thereof.

The method 1200 includes determining at least one of an external criterion or a signal-based criterion, at 1202. For example, the gain controller 130 of FIG. 1 determines at least one of the external criterion 132 or the signal-based criterion 134, as described with reference to FIGS. 1-5. The signal-based criterion 134 is based on whether the signal metric 162 associated with the gain adjusted signal 111 or the signal metric 164 associated with the gain adjusted signal 121 is closer to the target metric 160, as described with reference to FIG. 4.

The method 1200 also includes, based on the at least one determined criterion, outputting the first gain adjusted signal from a first gain adjuster or the second gain adjusted signal from a second gain adjuster as an input to an audio processing operation, at 1204. For example, the gain controller 130 of FIG. 1, based on at least the external criterion 132 or the signal-based criterion 134, outputs the gain adjusted signal 111 from the gain adjuster 110 or the gain adjusted signal 121 from the gain adjuster 120 as an input to the voice activation system 150, as described with reference to FIGS. 1-5. The gain adjusted signal 111 is based on applying the gain 115 to the audio signal 107 from the microphone 104 and the gain adjusted signal 121 is based on applying the gain 125 to the audio signal 107.

In some implementations, the method 1200 also includes selecting, based on the mode selection criteria 205, a mode (e.g., the selected mode 207) from the single channel mode 180, the multi-channel mode 182, or the polling mode 184, as described with reference to the mode selector 202 of FIG. 2. The gain adjusted signal 111 or the gain adjusted signal 121 is output to the audio processing operation 152 based on the selected mode 207. The mode selection criteria 205 includes the performance criterion 231, the power criterion 233, the external criterion 132, a default value, a configuration setting, or a combination thereof.

The method 1200 enables dynamic selection of audio gain for generating a gain adjusted signal to improve performance of an audio processing operation on the gain adjusted signal. For example, a higher gain is applied to an audio signal with a lower input audio level and a lower gain is applied to an audio signal with a higher input audio level. The lower gain prevents saturation when the audio signal has a higher input audio level, whereas the higher gain improves speech detection when the audio signal has a lower input audio level.

The method 1200 of FIG. 12 may be implemented by a field-programmable gate array (FPGA) device, an application-specific integrated circuit (ASIC), a processing unit such as a central processing unit (CPU), a DSP, a controller, another hardware device, firmware device, or any combination thereof. As an example, the method 1200 of FIG. 12 may be performed by a processor that executes instructions, such as described with reference to FIG. 13.

Referring to FIG. 13, a block diagram of a particular illustrative implementation of a device is depicted and generally designated 1300. In various implementations, the device 1300 may have more or fewer components than illustrated in FIG. 13. In an illustrative implementation, the device 1300 may correspond to the device 102. In an illustrative implementation, the device 1300 may perform one or more operations described with reference to FIGS. 1-12.

In a particular implementation, the device 1300 includes a processor 1306 (e.g., a central processing unit (CPU)). The device 1300 may include one or more additional processors 1310 (e.g., one or more DSPs). In a particular aspect, the processor 190 of FIG. 1 corresponds to the processor 1306, the processors 1310, or a combination thereof. The processors 1310 may include a speech and music coder-decoder (CODEC) 1308, the gain controller 130, the external system 140, the voice activation system 150, or a combination thereof. The speech and music codec 1308 may include a voice coder ("vocoder") encoder 1336, a vocoder decoder 1338, or both.

The device 1300 may include a memory 1386 and a CODEC 1334. The memory 1386 may include instructions 1356, that are executable by the one or more additional processors 1310 (or the processor 1306) to implement the functionality described with reference to the gain controller 130, the external system 140, the voice activation system 150, or any combination thereof. The device 1300 may include a wireless controller 1340 coupled, via a transceiver 1350, to an antenna 1352.

The device 1300 may include a display 1328 coupled to a display controller 1326. A speaker 1392 and the microphone 104 may be coupled to the CODEC 1334. The CODEC 1334 may include a digital-to-analog converter 1302, the gain adjuster 110, and the gain adjuster 120. In a particular implementation, the CODEC 1334 may receive analog signals from the microphone 104, convert the analog signals to digital signals using at least one of the gain adjuster 110 or the gain adjuster 120, and provide the digital signals to the speech and music codec 1308. The speech and music codec 1308 may process the digital signals, and the digital signals may further be processed by the voice activation system 150. In a particular implementation, the speech and music codec 1308 may provide digital signals to the CODEC 1334. The CODEC 1334 may convert the digital signals to analog signals using the digital-to-analog converter 1302 and may provide the analog signals to the speaker 1392.

In a particular implementation, the device 1300 may be included in a system-in-package or system-on-chip device 1322. In a particular implementation, the memory 1386, the processor 1306, the processors 1310, the display controller 1326, the CODEC 1334, and the wireless controller 1340 are included in a system-in-package or system-on-chip device 1322. In a particular implementation, an input device 1330 and a power supply 1344 are coupled to the system-on-chip device 1322. Moreover, in a particular implementation, as illustrated in FIG. 13, the display 1328, the input device 1330, the speaker 1392, the microphone 104, the antenna 1352, and the power supply 1344 are external to the system-on-chip device 1322. In a particular implementation, each of the display 1328, the input device 1330, the speaker 1392, the microphone 104, the antenna 1352, and the power supply 1344 may be coupled to a component of the system-on-chip device 1322, such as an interface or a controller.

The device 1300 may include a smart speaker, a speaker bar, a mobile communication device, a smart phone, a cellular phone, a laptop computer, a computer, a tablet, a personal digital assistant, a display device, a television, a gaming console, a music player, a radio, a digital video player, a digital video disc (DVD) player, a tuner, a camera, a navigation device, a vehicle, a headset, an augmented reality headset, a virtual reality headset, an aerial vehicle, a home automation system, a voice-activated device, a wireless speaker and voice activated device, a portable electronic device, a car, a vehicle, a computing device, a communication device, an internet-of-things (IoT) device, a virtual reality (VR) device, a base station, a mobile device, or any combination thereof.

In conjunction with the described implementations, an apparatus includes means for determining at least one of an external criterion or a signal-based criterion. The signal-based criterion is based on whether a first signal metric associated with a first gain adjusted signal or a second signal metric associated with a second gain adjusted signal is closer to a target metric. For example, the means for determining can correspond to the gain controller 130, the processor 190, the one or more processors 1310, one or more other circuits or components configured to determine at least one of an external criterion or a signal-based criterion, or any combination thereof.

The apparatus also includes means for outputting one of the first gain adjusted signal from a first gain adjuster or the second gain adjusted signal from a second gain adjuster as an input to an audio processing operation. The one of the first gain adjusted signal or the second gain adjusted signal output is based on the at least determined criterion. The first gain adjusted signal is based on applying a first gain to an audio signal from a microphone. The second gain adjusted signal is based on applying a second gain to the audio signal. For example, the means for outputting can correspond to the gain controller 130, the processor 190, the one or more processors 1310, one or more other circuits or components configured to output one of the first gain adjusted signal from a first gain adjuster or the second gain adjusted signal from a second gain adjuster, or any combination thereof.

In some implementations, a non-transitory computer-readable medium (e.g., a computer-readable storage device, such as the memory 1386) includes instructions (e.g., the instructions 1356) that, when executed by one or more processors (e.g., the one or more processors 1310 or the processor 1306), cause the one or more processors to perform operations to determine at least one of an external criterion (e.g., the external criterion 132) or a signal-based criterion (e.g., the signal-based criterion 134). The signal-based criterion (e.g., the signal-based criterion 134) is based on whether a first signal metric (e.g., the signal metric 162) associated with a first gain adjusted signal (e.g., the gain adjusted signal 111) or a second signal metric (e.g., signal metric 164) associated with a second gain adjusted signal (e.g., gain adjusted signal 121) is closer to a target metric (e.g., target metric 160). The instructions (e.g., the instructions 1356), when executed by the one or more processors, also cause the one or more processors to, based on the at least one determined criterion, output the first gain adjusted signal (e.g., the gain adjusted signal 111) from a first gain adjuster (e.g., the gain adjuster 110) or the second gain adjusted signal (e.g., the gain adjusted signal 121) from a second gain adjuster (e.g., gain adjuster 120) as an input to an audio processing operation (e.g., the audio processing operation 152). The first gain adjusted signal (e.g., the gain adjusted signal 111) is based on applying a first gain (e.g., the gain 115) to an audio signal (e.g., the audio signal 107) from a microphone (e.g., the microphone 104). The second gain adjusted signal (e.g., the gain adjusted signal 121) is based on applying a second gain (e.g., the gain 125) to the audio signal (e.g., audio signal 107).

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, such implementation decisions are not to be interpreted as causing a departure from the scope of the present disclosure.

The steps of a method or algorithm described in connection with the implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A device comprising:
   a memory configured to store instructions; and
   one or more processors coupled to the memory and configured to execute the instructions to, during a multi-channel mode and based on at least one of an external criterion or a signal-based criterion, select one of a first gain adjusted signal from a first gain adjuster or a second gain adjusted signal from a second gain adjuster as an input to an audio processing operation, the first gain adjusted signal corresponding to a first gain applied to an audio signal from a microphone and the second gain adjusted signal corresponding to a second gain applied to the audio signal, wherein the signal-based criterion is based on whether a first signal metric associated with the first gain adjusted signal or a second signal metric associated with the second gain adjusted signal is closer to a target metric.

2. The device of claim 1, wherein the audio processing operation includes keyword detection of a voice activation system, wherein the first signal metric includes a first root-mean-square (RMS) value of the first gain adjusted signal, wherein the second signal metric includes a second RMS value of the second gain adjusted signal, wherein the target metric includes a target RMS value, and wherein the one or more processors are configured to provide one of the first gain adjusted signal or the second gain adjusted signal that has a closer RMS value to the target RMS value for the keyword detection.

3. The device of claim 1, wherein the external criterion includes a time-based criterion, and wherein the one or more processors are configured to, during late night hours, provide the second gain adjusted signal to the audio processing operation.

4. The device of claim 1, further comprising:
   an input interface configured to receive the audio signal from the microphone;
   the first gain adjuster coupled to the input interface and configured to apply the first gain to the audio signal; and
   the second gain adjuster coupled to the input interface and configured to apply the second gain to the audio signal.

5. The device of claim 4, wherein the audio signal includes an analog signal, and wherein the first gain adjuster is configured to:
   apply the first gain to the analog signal to generate a first gain adjusted analog signal; and
   perform an analog-to-digital conversion on the first gain adjusted analog signal to generate the first gain adjusted signal.

6. The device of claim 4, wherein the audio signal includes an analog signal, and wherein the first gain adjuster is configured to:
   generate a digital signal by performing an analog-to-digital conversion on the analog signal; and
   apply the first gain to the digital signal to generate the first gain adjusted signal.

7. The device of claim 1, wherein the external criterion includes a user-proximity criterion, and wherein the one or more processors are configured to, in response to determining that a detected distance of a user is within a threshold distance, provide the first gain adjusted signal to the audio processing operation.

8. The device of claim 7, further comprising the microphone, wherein the one or more processors are configured to execute the instructions to determine the detected distance based on the audio signal.

9. The device of claim 7, further comprising a camera, wherein the one or more processors are configured to execute the instructions to determine the detected distance based on image data from the camera.

10. The device of claim 1, wherein the external criterion includes a movement-based criterion, and wherein the one or more processors are configured to, in response to determining that a detected movement is greater than a threshold movement, provide the first gain adjusted signal to the audio processing operation.

11. The device of claim 10, further comprising a global positioning system (GPS) receiver, wherein the one or more processors are configured to determine the detected movement based on GPS data from the GPS receiver.

12. The device of claim 10, further comprising a camera, wherein the one or more processors are configured to determine the detected movement based on image data from the camera.

13. The device of claim 10, further comprising an accelerometer, wherein the one or more processors are configured to determine the detected movement based on accelerometer data from the accelerometer.

14. The device of claim 1, wherein the one or more processors are configured to execute the instructions to select, based on one or more mode selection criteria, a mode from a single channel mode, the multi-channel mode, or a polling mode, wherein the first gain adjusted signal or the second gain adjusted signal is output to the audio processing operation based on the selected mode.

15. The device of claim 1, wherein the one or more processors are configured to execute the instructions to, during a single channel mode and based on the external criterion, output the first gain adjusted signal by activating the first gain adjuster to generate the first gain adjusted signal and deactivating the second gain adjuster to prevent generation of the second gain adjusted signal.

16. The device of claim 1, wherein the one or more processors are configured to execute the instructions to, during a single channel mode and based on a power setting, a performance setting, or both:
transition from the single channel mode to the multi-channel mode by activating both the first gain adjuster to generate the first gain adjusted signal and the second gain adjuster to generate the second gain adjusted signal; and
select one of the first gain adjusted signal or the second gain adjusted signal to output to the audio processing operation.

17. The device of claim 14, wherein the one or more mode selection criteria include a performance criterion, a power criterion, the external criterion, a default value, a configuration setting, or a combination thereof.

18. The device of claim 1, wherein the first gain and the second gain are based on one or more default values, configuration settings, user inputs, hardware configurations, or a combination thereof.

19. The device of claim 1, wherein the one or more processors are configured to execute the instructions to, after a first polling duration during a polling mode, deactivate, for a first inter-polling duration, one of the first gain adjuster or the second gain adjuster corresponding to the non-selected one of the first gain adjusted signal or the second gain adjusted signal.

20. The device of claim 19, wherein the one or more processors are configured to execute the instructions to output the selected one of the first gain adjusted signal or the second gain adjusted signal to the audio processing operation during the first inter-polling duration.

21. The device of claim 19, wherein the one or more processors are configured to execute the instructions to, during the polling mode and subsequent to the first inter-polling duration:
reactivate the deactivated one of the first gain adjuster or the second gain adjuster; and
select one of the first gain adjusted signal received from the first gain adjuster or the second gain adjusted signal received from the second gain adjuster to output to the audio processing operation during a second polling duration.

22. The device of claim 19, wherein the first inter-polling duration is based on a power setting, a performance setting, or both.

23. The device of claim 19, wherein the one or more processors are configured to execute the instructions to determine that the first inter-polling duration has elapsed based on determining whether a timer has expired, whether movement is detected, whether a detected time is within a particular time range, whether proximity to a user is detected, or a combination thereof.

24. A method comprising:
determining at least one criterion from among an external criterion or a signal-based criterion, wherein the signal-based criterion is based on whether a first signal metric associated with a first gain adjusted signal or a second signal metric associated with a second gain adjusted signal is closer to a target metric; and
during a multi-channel mode and based on the at least one determined criterion, selecting one of the first gain adjusted signal from a first gain adjuster or the second gain adjusted signal from a second gain adjuster as an input to an audio processing operation,
wherein the first gain adjusted signal is based on applying a first gain to an audio signal from a microphone and wherein the second gain adjusted signal is based on applying a second gain to the audio signal.

25. The method of claim 24, further comprising selecting, based on one or more mode selection criteria, a mode from a single channel mode, the multi-channel mode, or a polling mode, wherein the first gain adjusted signal or the second gain adjusted signal is output to the audio processing operation based on the selected mode.

26. The method of claim 25, wherein the one or more mode selection criteria include a performance criterion, a power criterion, the external criterion, a default value, a configuration setting, or a combination thereof.

27. A non-transitory computer-readable storage medium storing instructions that, when executed by one or more processors, cause the one or more processors to:
determine at least one criterion from among an external criterion or a signal-based criterion, wherein the signal-based criterion is based on whether a first signal metric associated with a first gain adjusted signal or a second signal metric associated with a second gain adjusted signal is closer to a target metric; and
during a multi-channel mode and based on the at least one determined criterion, select one the first gain adjusted signal from a first gain adjuster or the second gain adjusted signal from a second gain adjuster as an input to an audio processing operation, wherein the first gain adjusted signal is based on applying a first gain to an audio signal from a microphone, wherein the second gain adjusted signal is based on applying a second gain to the audio signal.

28. The non-transitory computer-readable storage medium of claim 27, wherein the instructions, when executed by the one or more processors, cause the one or more processors to select, based on one or more mode selection criteria, a mode from a single channel mode, the multi-channel mode, or a polling mode, wherein the first gain adjusted signal or the second gain adjusted signal is output to the audio processing operation based on the selected mode.

29. An apparatus comprising:
  means for determining at least one criterion from among an external criterion or a signal-based criterion, wherein the signal-based criterion is based on whether a first signal metric associated with a first gain adjusted signal or a second signal metric associated with a second gain adjusted signal is closer to a target metric; and
  means for selecting one of the first gain adjusted signal from a first gain adjuster or the second gain adjusted signal from a second gain adjuster as an input to an audio processing operation, the one of the first gain adjusted signal or the second gain adjusted signal selected during a multi-channel mode and based on the at least one determined criterion, wherein the first gain adjusted signal is based on applying a first gain to an audio signal from a microphone, and wherein the second gain adjusted signal is based on applying a second gain to the audio signal.

30. The apparatus of claim 29, wherein the means for determining and the means for selecting are integrated into at least one of a home automation system, a voice-activated device, a wireless speaker and voice activated device, a portable electronic device, a car, a vehicle, a computing device, a communication device, an internet-of-things (IoT) device, a virtual reality (VR) device, a base station, a mobile device, or a combination thereof.

* * * * *